(12) United States Patent
Ludwig et al.

(10) Patent No.: US 10,042,479 B2
(45) Date of Patent: *Aug. 7, 2018

(54) HETEROGENEOUS TACTILE SENSING VIA MULTIPLE SENSOR TYPES USING SPATIAL INFORMATION PROCESSING

(71) Applicant: NRI R&D PATENT LICENSING, LLC, San Antonio, TX (US)

(72) Inventors: Lester F. Ludwig, San Antonio, TX (US); Vadim Zaliva, Saratoga, CA (US)

(73) Assignee: NRI R&D Patent Licensing, LLC, San Antonio, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/804,778

(22) Filed: Nov. 6, 2017

(65) Prior Publication Data

US 2018/0059873 A1 Mar. 1, 2018

Related U.S. Application Data

(63) Continuation of application No. 13/706,214, filed on Dec. 5, 2012, now Pat. No. 9,823,781.

(Continued)

(51) Int. Cl.
*G06F 3/045* (2006.01)
*G06F 3/042* (2006.01)
(Continued)

(52) U.S. Cl.
CPC ............ *G06F 3/0425* (2013.01); *G06F 3/017* (2013.01); *G06F 3/0416* (2013.01);
(Continued)

(58) Field of Classification Search
CPC .... G06F 3/017; G06F 3/0416; G06F 3/04883; G06F 2203/04106; G06F 3/041; G06F 3/0425; G06F 3/0488; H03K 17/96
See application file for complete search history.

(56) References Cited

U.S. PATENT DOCUMENTS 4,748,676 A   5/1988 Miyagawa
4,899,137 A   2/1990 Behrens et al.
(Continued)

FOREIGN PATENT DOCUMENTS

EP    0 574 213 B1   12/1993

OTHER PUBLICATIONS

Dulberg, M. S., et al. An Imprecise Mouse Gesture for the Fast Activation of Controls, IOS Press, Aug. 1999, [online] [retrieved on Jul. 9, 2013] URL: http://www.csc.ncsu.edu/faculty/stamant/papers/interact.pdf.gz, 10 pgs.

(Continued)

*Primary Examiner* — Insa Sadio
(74) *Attorney, Agent, or Firm* — Procopio, Cory, Hargreaves & Savitch LLP

(57) ABSTRACT

This invention relates to sensor arrangements and signal processing architectures for touch-based user interfaces comprising multiple sensor types and other arrangements so as to create user interface output signals responsive to the touch of at least one human finger. Sensor types and other arrangements can include capacitive tactile sensor arrays, optical tactile sensor arrays, proximity sensor arrays, pressure sensor arrays, and video cameras. At least one software algorithm comprises at least one of a functional partition (wherein some user interface output signals are derived only from a pre-specified sensor), decision-based selection (wherein some user interface output signals are selectively derived from a selected sensor), or spatial information processing (wherein user interface output signals are obtained from threshold testing, conditional testing, vector quantization, algorithms employing parameterized calculations, algorithms employing compensation calculations and operations, artificial neural networks, etc.).

18 Claims, 39 Drawing Sheets

Related U.S. Application Data

(60) Provisional application No. 61/567,623, filed on Dec. 6, 2011.

(51) Int. Cl.
  *G06F 3/01*       (2006.01)
  *G06F 3/041*      (2006.01)
  *G06F 3/0488*     (2013.01)
  *H03K 17/96*      (2006.01)

(52) U.S. Cl.
  CPC ......... *G06F 3/04883* (2013.01); *H03K 17/96* (2013.01); *G06F 2203/04106* (2013.01)

(56) References Cited

U.S. PATENT DOCUMENTS

| | | |
|---|---|---|
| 5,237,647 A | 8/1993 | Roberts et al. |
| 5,270,711 A | 12/1993 | Knapp |
| 5,292,999 A | 3/1994 | Tumura |
| 5,341,133 A | 8/1994 | Savoy |
| 5,347,295 A | 9/1994 | Agulnick et al. |
| 5,357,048 A | 10/1994 | Sgroi |
| 5,378,850 A | 1/1995 | Tumura |
| 5,386,219 A | 1/1995 | Greanias |
| 5,420,936 A | 5/1995 | Fitzpatrick |
| 5,440,072 A | 8/1995 | Willis |
| 5,442,168 A | 8/1995 | Gurner et al. |
| 5,459,282 A | 10/1995 | Willis |
| 5,471,008 A | 11/1995 | Fujita et al. |
| 5,475,214 A | 12/1995 | DeFranco et al. |
| 5,565,641 A | 10/1996 | Gruenbaum |
| 5,585,588 A | 12/1996 | Tumura |
| 5,592,572 A | 1/1997 | Le |
| 5,592,752 A | 1/1997 | Fu |
| 5,659,145 A | 8/1997 | Weil |
| 5,659,466 A | 8/1997 | Norris et al. |
| 5,665,927 A | 9/1997 | Taki et al. |
| 5,668,338 A | 9/1997 | Hewitt et al. |
| 5,675,100 A | 10/1997 | Hewlett |
| 5,717,939 A | 2/1998 | Bricklin et al. |
| 5,719,347 A | 2/1998 | Masubachi et al. |
| 5,719,561 A | 2/1998 | Gonzales |
| 5,724,985 A | 3/1998 | Snell |
| 5,741,993 A | 4/1998 | Kushimiya |
| 5,748,184 A | 5/1998 | Shieh |
| 5,786,540 A | 7/1998 | Westlund |
| 5,763,806 A | 8/1998 | Willis |
| 5,801,340 A | 9/1998 | Peter |
| 5,805,137 A | 9/1998 | Yasutake |
| 5,824,930 A | 10/1998 | Ura et al. |
| 5,827,989 A | 10/1998 | Fay et al. |
| 5,841,428 A | 11/1998 | Jaeger et al. |
| 5,850,051 A | 12/1998 | Machover et al. |
| 5,852,251 A | 12/1998 | Su et al. |
| 5,889,236 A | 3/1999 | Gillespie et al. |
| 5,932,827 A | 8/1999 | Osborne et al. |
| 5,969,283 A | 10/1999 | Looney et al. |
| 5,977,466 A | 11/1999 | Muramatsu |
| 5,986,224 A | 11/1999 | Kent |
| 6,005,545 A | 12/1999 | Nishida et al. |
| 6,037,937 A | 3/2000 | Beaton et al. |
| 6,047,073 A | 4/2000 | Norris et al. |
| 6,051,769 A | 4/2000 | Brown, Jr. |
| 6,100,461 A | 8/2000 | Hewitt |
| 6,107,997 A | 8/2000 | Ure |
| 6,140,565 A | 10/2000 | Yamauchi et al. |
| 6,204,441 B1 | 3/2001 | Asahi et al. |
| 6,225,975 B1 | 5/2001 | Furuki et al. |
| 6,285,358 B1 | 9/2001 | Roberts |
| 6,288,317 B1 | 9/2001 | Willis |
| 6,310,279 B1 | 10/2001 | Suzuki et al. |
| 6,310,610 B1 | 10/2001 | Beaton et al. |
| 6,320,112 B1 | 11/2001 | Lotze |
| 6,323,846 B1 | 11/2001 | Westerman et al. |
| 6,360,019 B1 | 3/2002 | Chaddha |
| 6,363,159 B1 | 3/2002 | Rhoads |
| 6,373,475 B1 | 4/2002 | Challis |
| 6,392,636 B1 | 5/2002 | Ferrari |
| 6,392,705 B1 | 5/2002 | Chaddha |
| 6,400,836 B2 | 6/2002 | Senior |
| 6,404,898 B1 | 6/2002 | Rhoads |
| 6,408,087 B1 | 6/2002 | Kramer |
| 6,570,078 B2 | 5/2003 | Ludwig |
| 6,703,552 B2 | 3/2004 | Haken |
| 6,793,619 B1 | 9/2004 | Blumental |
| 7,030,860 B1 | 4/2006 | Hsu et al. |
| 7,408,108 B2 | 8/2008 | Ludwig |
| 7,557,797 B2 | 7/2009 | Ludwig |
| 7,598,949 B2 | 10/2009 | Han |
| 7,611,409 B2 | 11/2009 | Muir et al. |
| 8,154,529 B2 | 4/2012 | Sleeman |
| 8,169,414 B2 | 5/2012 | Lim |
| 8,170,346 B2 | 5/2012 | Ludwig |
| 8,179,376 B2 | 5/2012 | Griffin |
| 8,345,014 B2 | 1/2013 | Lim |
| 2001/0036299 A1 | 11/2001 | Senior |
| 2002/0005108 A1 | 1/2002 | Ludwig |
| 2002/0093491 A1 | 7/2002 | Gillespie et al. |
| 2004/0074379 A1 | 4/2004 | Ludwig |
| 2004/0118268 A1 | 6/2004 | Ludwig |
| 2004/0251402 A1 | 12/2004 | Reime |
| 2006/0252530 A1 | 11/2006 | Oberberger et al. |
| 2007/0044019 A1 | 2/2007 | Moon |
| 2007/0063990 A1 | 3/2007 | Park |
| 2007/0229477 A1 | 10/2007 | Ludwig |
| 2008/0010616 A1 | 1/2008 | Algreatly |
| 2008/0143690 A1 | 6/2008 | Jang |
| 2008/0164076 A1 | 7/2008 | Orsley |
| 2008/0259053 A1 | 10/2008 | Newton |
| 2008/0297482 A1 | 12/2008 | Weiss |
| 2008/0300055 A1 | 12/2008 | Lutnick |
| 2008/0309634 A1 | 12/2008 | Hotelling et al. |
| 2009/0006292 A1 | 1/2009 | Block |
| 2009/0027351 A1 | 1/2009 | Zhang et al. |
| 2009/0124348 A1 | 5/2009 | Yoseloff et al. |
| 2009/0146968 A1 | 6/2009 | Narita et al. |
| 2009/0167701 A1 | 7/2009 | Ronkainen |
| 2009/0254869 A1 | 10/2009 | Ludwig |
| 2010/0013860 A1 | 1/2010 | Mandella |
| 2010/0044121 A1 | 2/2010 | Simon |
| 2010/0060607 A1 | 3/2010 | Ludwig |
| 2010/0079385 A1 | 4/2010 | Holmgren |
| 2010/0087241 A1 | 4/2010 | Nguyen et al. |
| 2010/0090963 A1 | 4/2010 | Dubs |
| 2010/0110025 A1 | 5/2010 | Lim |
| 2010/0117978 A1 | 5/2010 | Shirado |
| 2010/0177118 A1 | 7/2010 | Sytnikov |
| 2010/0231550 A1 | 9/2010 | Cruz-Hernandez et al. |
| 2010/0231612 A1 | 9/2010 | Chaudhri et al. |
| 2010/0232710 A1 | 9/2010 | Ludwig |
| 2010/0267424 A1 | 10/2010 | Kim et al. |
| 2010/0289754 A1 | 11/2010 | Sleeman et al. |
| 2010/0302172 A1 | 12/2010 | Wilairat |
| 2010/0328032 A1 | 12/2010 | Rofougaran |
| 2011/0007000 A1 | 1/2011 | Lim |
| 2011/0037735 A1 | 2/2011 | Land |
| 2011/0063251 A1 | 3/2011 | Geaghan |
| 2011/0086706 A1 | 4/2011 | Zalewski |
| 2011/0202889 A1 | 8/2011 | Ludwig |
| 2011/0202934 A1 | 8/2011 | Ludwig |
| 2011/0210943 A1* | 9/2011 | Zaliva ................ G06F 3/0414 345/174 |
| 2011/0260998 A1* | 10/2011 | Ludwig ............... G06F 3/0414 345/173 |
| 2011/0261049 A1 | 10/2011 | Cardno et al. |
| 2011/0285648 A1 | 11/2011 | Simon et al. |
| 2012/0007821 A1 | 1/2012 | Zaliva |
| 2012/0034978 A1 | 2/2012 | Lim |
| 2012/0056846 A1 | 3/2012 | Zaliva |
| 2012/0194461 A1 | 4/2012 | Lim |
| 2012/0108323 A1 | 5/2012 | Kelly et al. |
| 2012/0192119 A1 | 7/2012 | Zaliva |
| 2012/0194462 A1 | 8/2012 | Lim |
| 2012/0195522 A1 | 8/2012 | Ludwig |

(56) References Cited

U.S. PATENT DOCUMENTS

| | | |
|---|---|---|
| 2012/0223903 A1 | 9/2012 | Ludwig |
| 2012/0235940 A1 | 9/2012 | Ludwig |
| 2012/0262401 A1 | 10/2012 | Rofougaran |
| 2012/0280927 A1 | 11/2012 | Ludwig |
| 2012/0317521 A1 | 12/2012 | Ludwig |
| 2013/0009896 A1 | 1/2013 | Zaliva |
| 2013/0038554 A1 | 2/2013 | West |

OTHER PUBLICATIONS

Moyle, M., et al. A Flick in the Right Direction: A Case Study of Gestural Input, Conferences in Research and Practice in Information Technology, vol. 18, Jan. 2005; New Zealand, [online] [retrieved on Jul. 9, 2013] URL:http://www.cosc.canterbury.ac.nz/andrew.cockburn/papers/moyle-cockburn.pdf, 27 pgs.

Maltoni, D., et al., "Handbook of Fingerprint Recognition," Springer Professional Computing, 2nd ed. 2009, XVI, p. 74, p. 361, [online] [retrieved on Jul. 9, 2013] URL: http://books.google.com/books?id=1Wpx25D8qOwC&pg=PA36lpg=PA361&dq=fingerprint+minutiae, 2 pgs.

VeriFinger Information, [online] [retrieved on Jun. 11, 2013] URL: http://www.fingerprint-it.com/_sol_verifinger.html, 2 pgs.

Prabhakar S., et al., Learning fingerprint minutiae location and type, Pattern Recognition 2003, 36, [online] URL: http://www.cse.msu.edu/biometrics/Publications/Fingerprint/PrabhakarJainPankanti_MinaLocType_PR03.pdf, pp. 1847-1857.

Garcia Reyes, E., An Automatic Goodness Index to Measure Fingerprint Minutiae Quality, Progress in Pattern Recognition, Image Analysis and Applications, Lecture Notes in Computer Science vol. 3773, 2005, pp. 578-585, [online] [retrieved on Jun. 2, 2013] URL: http://www.researchgate.net/publication/226946511_An_Automatic_Goodness_Index_to_Measure_Fingerprint_Minutiae_Quality/file/d912f50ba5e96320d5.pdf.

Kayaoglu, M., et al., Standard Fingerprint Databases: Manual Minutiae Labeling and Matcher Performance Analyses, arXiv preprint arXiv:1305.1443, 2013, 14 pgs, [online] [retrieved on Jun. 2, 2013] URL: http://arxiv.org/ftp/arxiv/papers/1305/1305.1443.pdf.

Alonso-Fernandez, F., et al., Fingerprint Recognition, Chapter 4, Guide to Biometric Reference Systems and Performance Evaluation, (Springer, London, 2009, pp. 51-90, [online] [retrieved on Jun. 2, 2013] URL: http://www2.hh.se/staff/josef/public/publications/alonso-fernandez09chapter.pdf.

Image moment, Jul. 12, 2010, 3 pgs, [online] [retrieved on Jun. 13, 2013] URL: http://en.wikipedia.org/wiki/Image_moment.

Nguyen, N., et al., Comparisons of sequence labeling algorithms and extensions, Proceedings of the 24th International Conference on Machine Learning, 2007, [online] [retrieved on Jun. 2, 2013] URL: http://www.cs.cornell.edu/~nhnguyen/icml07structured.pdf, pp. 681-688.

Nissen, S., Implementation of a Fast Artificial Neural Network Library (FANN), Department of Computer Science University of Copenhagen (DIKU)}, Oct. 31, 2003, [online] [retrieved on Jun. 21, 2013] URL: http://mirror.transact.net.au/sourceforge/f/project/fa/fann/fann_doc/1.0/fann_doc_complete_1.0.pdf, 92 pgs.

Igel, C., et al., Improving the Rprop Learning Algorithm, Proceedings of the Second International ICSC Symposium on Neural Computation (NC 2000), 2000, 2000, [online] [retrieved on Jun. 2, 2013] URL: http://citeseerx.ist.psu.edu/viewdoc/download?doi=10.1.1.17.3899&rep=rep1&type=pdf, pp. 115-121.

Bishop, C.M., Pattern Recognition and Machine Learning, Springer New York, 2006, pp. 561-593.

Euler Angles, 2011, [online] [retrieved on Jun. 30, 2011] URL: http://en.wikipedia.org/w/index.php?title=Euler_angles&oldid=436460926, 8 pgs.

Electronic Statistics Textbook, StatSoft, Inc., 2011, [online] [retrieved on Jul. 1, 2011] URL: http://www.statsoft.com/textbook, 1 pg.

Central Moment, Dec. 16, 2009, [online] [retrieved on Oct. 26, 2010] URL: http://en.wikipedia.org/w/index.php?title=Central_moment&oldid=332048374.

Local regression, Nov. 16, 2010, [online] [retrieved on Jun. 28, 2011] URL: http://en.wikipedia.org/w/index.php?title=Local_regression&oldid=416762287.

USPTO Notice of Allowance dated Jun. 6, 2013 issued in U.S. Appl. No. 13/846,830, filed Mar. 18, 2013.

Hernandez-Leon, R., et al., Classifying using Specific Rules with High Confidence, 9th Mexican International Conference on Artificial Intelligence, IEEE, Nov. 2010, pp . 75-80.

Fang, Y., et al., Dynamics of a Winner-Take-All Neural Network, Neural Networks, 9(7), Oct. 1996, pp. 1141-1154.

Viberg, M., Subspace Fitting Concepts in Sensor Array Processing, Department of Electrical Engineering, Linkoping University, 1989, Sweden, 15 pgs.

Moog, R. A., The Human Finger-A Versatile Electronic Music Instrument Component, Audio Engineering Society Preprint, 1977, New York, NY, 4 pgs.

Johnson, C., Image sensor tracks moving objects in hardware, Electronic Engineering Times, Apr. 5, 1999, 1 pg.

Kaoss pad dynamic effect/controller, Korg Proview Users' magazine Summer 1999, 2 pgs.

Leiberman, D., Touch screens extend grasp Into consumer realm, Electronic Engineering Times, Feb. 8, 1999.

Lim, et al., A Fast Algorithm for Labelling Connected Components in Image Arrays, Technical Report Series, No. NA86-2, Thinking Machines Corp., 1986 (rev. 1987), Cambridge, Mass., USA, 17 pgs.

Pennywitt, K., Robotic Tactile Sensing, Byte, Jan. 1986, 14 pgs.

Review of KORG X-230 Drum (later called Wave Drum), Electronic Musician, Apr. 1994, 1 pg.

Rich, R., Buchla Lightning MIDI Controller, Electronic Musician, Oct. 1991, 5 pgs.

Rich, R., Buchla Thunder, Electronic Musician, Aug. 1990, 4 pgs.

USPTO Notice of Allowance dated May 24, 2013 issued in U.S. Appl. No. 13/442,815, filed Apr. 9, 2012.

USPTO Notice of Allowance dated Dec. 24, 2002 issued in U.S. Appl. No. 09/812,870, filed Mar. 19, 2001.

Otsu's method, [online] [retrieved on Jun. 26, 2013] URL: http://en.wikipedia.org/wiki/Otsu_method, Sep. 13, 2010, 2 pgs.

Principal component analysis, [online] [retrieved on Jun. 26, 2013] URL: http://en.wikipedia.org/wiki/Principal_component_analysis, Feb. 25, 2011, 9 pgs.

USPTO Notice of Allowance dated May 30, 2013 issued in U.S. Appl. No. 13/442,806, filed Apr. 9, 2012.

DIY Touchscreen Analysis, MOTO, [online] [retrieved on May 12, 2013] URL: http://labs.moto.com/diy-touchscreen-analysis/, Jul. 15, 2010, 23 pgs.

Wilson, T.V., How the iPhone Works, howstuffworks, [online] [retrieved on May 12, 2013] URL: http://electronics.howstuffworks.com/iphone2.htm, Jan. 8, 2011, 11 pgs.

Walker, G., Touch and the Apple iPhone, Veritas et Visus, [online] [retrieved on May 12, 2013] URL: http://www.veritasetvisus.com/VVTP-12,%20Walker.pdf, Feb. 2007, pp. 50-54.

Han, J., Multi-Touch Sensing through LED Matrix Displays (video), [online] [retrieved on May 12, 2013] "http://cs.nyu.edu/~jhan/ledtouch/index.html," Feb. 18, 2011, 1 pg.

Roberts Cross, [online] [retrieved on May 12, 2013] URL: http://en.wikipedia.org/wiki/Roberts_Cross, Jul. 20, 2010, visited Feb. 28, 2011, 3 pgs.

Sobel Operator, [online] [retrieved on May 12, 2013] URL: http://en.wikipedia.org/wiki/Sobel_operator, Mar. 12, 2010, visited Feb. 28, 2011, 5 pgs.

Dario P., et al., Tactile sensors and the gripping challenge, IEEE Spectrum, vol. 5, No. 22, Aug. 1985, pp. 46-52.

Snell, J. M., Sensors for Playing Computer Music with Expression, Proceedings of the Intl. Computer Music Conf. at Eastman, 1983, pp. 113-126.

Verner J., Artif Starr Switch Company Ztar 624-D, Electronic Musician, Nov. 1994, 5 pgs.

Haken, L., An Indiscrete Music Keyboard, Computer Music Journal, Spring 1998, pp. 30-48.

(56) References Cited

OTHER PUBLICATIONS

USPTO Notice of Allowance dated May 8, 2013 issued in U.S. Appl. No. 12/541,948, filed Aug. 15, 2009.
Buxton, W. A. S., Two-Handed Document Navigation, Xerox Disclosure Journal, 19(2), Mar./Apr. 1994 [online] [retreived on May 28, 2013] URL: http://www.billbuxton.com/2Hnavigation.html, pp. 103-108.
USPTO Notice of Allowance dated Mar. 20, 2012 issued in U.S. Appl. No. 12/724,413, filed Mar. 15, 2010.
USPTO Notice of Allowance dated Jan. 10, 2008 issued in U.S. Appl. No. 10/683,914, filed Oct. 10, 2003.
USPTO Notice of Allowance dated Nov. 9, 2012 issued in U.S. Appl. No. 12/502,230, filed Jul. 13, 2009.
USPTO Notice of Allowance dated Mar. 12, 2012 issued in U.S. Appl. No. 12/511,930, filed Jul. 29, 2009.
USPTO Notice of Allowance dated May 16, 2013 issued in U.S. Appl. No. 13/441,842, filed Apr. 7, 2012.
Balda AG, Feb. 26, 2011, [online] [retrieved on May 12, 2013] URL: http://www.balda.de, 1 pg.
Cypress Semiconductor, Feb. 28, 2011, [online] [retrieved on May 12, 2013] URL: http://www.cypress.com, 1 pg.
Synaptics, Jan. 28, 2011, [online] [retrieved on May 12, 2013] URL: http://www.synaptics.com, 1 pg.
Venolia, D., et al., T-Cube: A Fast, Self-Disclosing Pen-Based Alphabet, CHI '94 Proceedings of the SIGCHI Conference on Human Factors in Computing Systems, Apr. 24-28, 1994, pp. 265-270.
Davis, R. C., et al., NotePals: Lightweight Note Taking by the Group, for the Group, University of California, Berkeley, Computer Science Division, 1998, 8 pgs.
Rekimoto, Jun, Pick-and-Drop: A Direct Manipulation Technique for Multiple Computer Environments, Sony computer Science Laboratory Inc., Tokyo, Japan, 1997, [online] [retreived on May 30, 2013] URL: http://www.sonycsl.co.ip/person/rekimoto/papers/uist97.pdf, 8 pgs.
Davis, R. C., et al., NotePals: Lightweight Note Sharing by the Group, for the Group, [online] [retrieved on Jun. 2, 2013] URL: http://dub.washington.edu:2007/projects/notepals/pubs/notepals-chi99-final.pdf, 9 pgs.
Want, R., et al., The PARCTAB ubiquitous computing experiment, 1995-1996, [online] [retrieved on Jun. 10, 2013] URL: http://www.ece.rutgers.edu/~parashar/Classes/02-03/ece572/perv-reading/the-parctab-ubiquitous-computing.pdf, 44 pgs.
Prewitt, [online] [retrieved on May 12, 2013] URL: http://en.wikipedia.org/wiki/Prewitt, Mar. 15, 2010, visited Feb. 28, 2011, 2 pgs.
Coefficient of variation, [online] [retrieved on May 12, 2013] URL: http://en.wikipedia.org/wiki/Coefficient_of_variation, Feb. 15, 2010, visited Feb. 28, 2011, 2 pgs.
Canny edge detector, [online] [retrieved on May 12, 2013] http://en.wikipedia.org/wiki/Canny_edge_detector, Mar. 5, 2010, 4 pgs.
Polynomial regression, [online] [retrieved on May 12, 2013] URL: http://en.wikipedia.org/wiki/Polynomial_regression, Jul. 24, 2010, 4 pgs.
Pilu,M., et al., Training PDMs on models: The Case of Deformable Superellipses, Proceedings of the 7th British Machine Vision Conference, Edinburgh, Scotland, 1996, pp. 373-382, [online] [retrieved on Feb. 28, 2011] URL: https://docs.google.com/viewera=v&pid=explorer&chrome=true&srcid=0BxWzm3JBPnPmNDI1MDIxZGUtNGZhZi00NzJhLWFhZ-DMtNTJmYmRiMWYyMjBh&authkey=CPeVx4wO&hl=en.
Osian, M., et al., Fitting Superellipses to Incomplete Contours, IEEE Computer Society Conference on Computer Vision and Pattern Recognition Workshops (CVPRW '04), Jun. 2004, 8 pgs.
Hough transform, [online] [retrieved on Feb. 13, 2010] URL: http://en.wikipedia.org/wiki/Hough_transform, Feb. 13, 2010, 7 pgs.
Tactile Pressure Measurement, Pressure Mapping Systems, and Force Sensors and Measurement Systems, [online] [retrieved on Aug. 6, 2013] URL: http://www.tekscan.com, 2 pgs.
Tactile Surface Pressure and Force Sensors,Sensor Products LLC, Oct. 26, 2006, [online] [retrieved on Aug. 6, 2013] URL: http://www.sensorprod.com, 2 pgs.
Pressure Profile Systems, Jan. 29, 2011, [online] [retrieved on Jan. 29, 2011] URL: http://www.pressureprofile.com, 1 pg.
Xsensor Technology Corporation, Feb. 7, 2011, [online] [retrieved on May 12, 2013] URL: http://www.xsensor.com, 1 pg.

* cited by examiner

— PRIOR ART —

— PRIOR ART —

— PRIOR ART —

HETEROGENEOUS TACTILE SENSING VIA MULTIPLE SENSOR TYPES USING SPATIAL INFORMATION PROCESSING

CROSS-REFERENCE TO RELATED APPLICATION

This application is a continuation of U.S. application Ser. No. 13/706,214, filed Dec. 5, 2012, which claims the benefit of U.S. Provisional Application No. 61/567,623 filed Dec. 6, 2011, the disclosures of both of which are incorporated herein in their entireties by reference.

FIELD OF THE INVENTION

This invention relates to sensor arrangements and signal processing architectures for touch-based user interfaces, and more specifically to heterogeneous tactile sensing via multiple sensor types.

BACKGROUND OF THE INVENTION

By way of general introduction, touch screens implementing tactile sensor arrays have recently received tremendous attention with the addition multi-touch sensing, metaphors, and gestures.

Despite the many popular touch interfaces and gestures, there remains a wide range of additional control capabilities that can yet be provided by further enhanced user interface technologies. A number of enhanced touch user interface features are described in U.S. Pat. Nos. 6,570,078 and 8,169,414 as well as pending U.S. patent application Ser. Nos. 11/761,978, 12/418,605, 12/502,230, 12/541,948, and a significant number of related pending U.S. patent applications by the present and associated inventors. These patents and patent applications also address popular contemporary gesture and touch features.

Example Embodiments Employing a Touchpad and Touchscreen

FIGS. 1A-1G (adapted from U.S. patent application Ser. No. 12/418,605) and 2A-2E (adapted from U.S. Pat. No. 7,557,797) depict a number of arrangements and embodiments employing a touch-based user interface. FIG. 1A illustrates a touch-based user interface as a peripheral that can be used with a desktop computer (shown) or laptop (not shown). FIG. 1B depicts a touch-based user interface integrated into a laptop in place of the traditional touchpad pointing device. In FIGS. 1A-1B a touch-based user interface tactile sensor can be a stand-alone component or can be integrated over a display so as to form a touchscreen. FIG. 1C depicts a touch-based user interface integrated into a desktop computer display so as to form a touchscreen. FIG. 1D shows a touch-based user interface integrated into a laptop computer display so as to form a touchscreen. FIG. 1E depicts a touch-based user interface integrated into a cell phone, smartphone, PDA, or other hand-held consumer device. FIG. 1F shows a touch-based user interface integrated into a test instrument, portable service-tracking device, portable service-entry device, field instrument, or other hand-held industrial device. In FIGS. 1E-1F A touch-based user interface tactile sensor can be a stand-alone component or can be integrated over a display so as to form a touchscreen. FIG. 1G depicts a user interface touchscreen configuration that can be used in a tablet computer, wall-mount computer monitor, digital television, video conferencing screen, kiosk, etc. In at least the arrangements of FIGS. 1A, 1C, 1D, AND 1G, or other sufficiently large tactile sensor implementation of a touch-based user interface, more than one hand can be used an individually recognized as such.

FIGS. 2A-2E and FIGS. 3A-3B (these adapted from U.S. Pat. No. 7,557,797) depict various integrations of a touch-based user interface into the back of a conventional computer mouse. Any of these arrangements can employ a connecting cable, or the device can be wireless. In the integrations depicted in FIGS. 2A-2D a touch-based user interface tactile sensor can be a stand-alone component or can be integrated over a display so as to form a touchscreen. Such configurations have very recently become popularized by the product release of Apple "Magic Mouse™" although such combinations of a mouse with a tactile sensor array on its back responsive to multitouch and gestures were taught earlier in pending U.S. patent application Ser. No. 12/619, 678 (priority date Feb. 12, 2004) entitled "User Interface Mouse with Touchpad Responsive to Gestures and Multi-Touch."

In another embodiment taught in the specification of issued U.S. Pat. No. 7,557,797 and associated pending continuation applications more than two touchpads can be included in the advance mouse embodiment, for example as suggested in the arrangement of FIG. 2E. As with the arrangements of FIGS. 2A-2D, one or more of the plurality of touch-based user interface tactile sensors or exposed sensor areas of arrangements such as that of FIG. 2E can be integrated over a display so as to form a touchscreen. Other advance mouse arrangements include the integrated trackball/touchpad/mouse combinations of FIGS. 3A-3B taught in U.S. Pat. No. 7,557,797.

Overview of Touch-Based User Interface Sensor Technology

The information in this section provides an overview of HDTP user interface technology as described in U.S. Pat. Nos. 6,570,078 and 8,169,414 as well as pending U.S. patent application Ser. Nos. 11/761,978, 12/418,605, 12/502,230, 12/541,948, and related pending U.S. patent applications.

In an embodiment, a touchpad used as a pointing and data entry device can comprise an array of sensors. The array of sensors is used to create a tactile image of a type associated with the type of sensor and method of contact by the human hand. In one embodiment, the individual sensors in the sensor array are pressure sensors and a direct pressure-sensing tactile image is generated by the sensor array. In another embodiment, the individual sensors in the sensor array are proximity sensors and a direct proximity tactile image is generated by the sensor array. Since the contacting surfaces of the finger or hand tissue contacting a surface typically increasingly deforms as pressure is applied, the sensor array comprised of proximity sensors also provides an indirect pressure-sensing tactile image. In another embodiment, the individual sensors in the sensor array can be optical sensors. In one variation of this, an optical image is generated and an indirect proximity tactile image is generated by the sensor array. In another variation, the optical image can be observed through a transparent or translucent rigid material and, as the contacting surfaces of the finger or hand tissue contacting a surface typically increasingly deforms as pressure is applied, the optical sensor array also provides an indirect pressure-sensing tactile image. In some embodiments, the array of sensors can be transparent or translucent and can be provided with an underlying visual display element such as an alphanumeric, graphics, or image display. The underlying visual display can comprise, for example, an LED array display, a backlit LCD, etc. Such an underlying display can be used to render geometric boundaries or labels for soft-key functionality implemented with the tactile sensor array, to display status information, etc. Tactile array sensors implemented as transparent touchscreens are taught in the 1999 filings of issued U.S. Pat. No. 6,570,078 and pending U.S. patent application Ser. No. 11/761,978.

In an embodiment, the touchpad or touchscreen can comprise a tactile sensor array that obtains or provides individual measurements in every enabled cell in the sensor array that provides these as numerical values. The numerical values can be communicated in a numerical data array, as a sequential data stream, or in other ways. When regarded as a numerical data array with row and column ordering that can be associated with the geometric layout of the individual cells of the sensor array, the numerical data array can be regarded as representing a tactile image. The only tactile sensor array requirement to obtain the full functionality of a touch-based user interface is that the tactile sensor array produce a multi-level gradient measurement image as a finger, part of hand, or other pliable object varies is proximity in the immediate area of the sensor surface.

Such a tactile sensor array should not be confused with the "null/contact" touchpad which, in normal operation, acts as a pair of orthogonally responsive potentiometers. These "null/contact" touchpads do not produce pressure images, proximity images, or other image data but rather, in normal operation, two voltages linearly corresponding to the location of a left-right edge and forward-back edge of a single area of contact. Such "null/contact" touchpads, which are universally found in existing laptop computers, are discussed and differentiated from tactile sensor arrays in issued U.S. Pat. No. 6,570,078 and pending U.S. patent application Ser. No. 11/761,978. Before leaving this topic, it is pointed out that these the "null/contact" touchpads nonetheless can be inexpensively adapted with simple analog electronics to provide at least primitive multi-touch capabilities as taught in issued U.S. Pat. No. 6,570,078 and pending U.S. patent application Ser. No. 11/761,978 (pre-grant publication U.S. 2007/0229477 and therein, paragraphs [0022]-[0029], for example).

More specifically, FIG. 4 (adapted from U.S. patent application Ser. No. 12/418,605) illustrates the side view of a finger 401 lightly touching the surface 402 of a tactile sensor array. In this example, the finger 401 contacts the tactile sensor surface in a relatively small area 403. In this situation, on either side the finger curves away from the region of contact 403, where the non-contacting yet proximate portions of the finger grow increasingly far 404a, 405a, 404b, 405b from the surface of the sensor 402. These variations in physical proximity of portions of the finger with respect to the sensor surface should cause each sensor element in the tactile proximity sensor array to provide a corresponding proximity measurement varying responsively to the proximity, separation distance, etc. The tactile proximity sensor array advantageously comprises enough spatial resolution to provide a plurality of sensors within the area occupied by the finger (for example, the area comprising width 406). In this case, as the finger is pressed down, the region of contact 403 grows as the more and more of the pliable surface of the finger conforms to the tactile sensor array surface 402, and the distances 404a, 405a, 404b, 405b contract. If the finger is tilted, for example by rolling in the user viewpoint counterclockwise (which in the depicted end-of-finger viewpoint clockwise 407a) the separation distances on one side of the finger 404a, 405a will contract while the separation distances on one side of the finger 404b, 405b will lengthen. Similarly if the finger is tilted, for example by rolling in the user viewpoint clockwise (which in the depicted end-of-finger viewpoint counterclockwise 407b) the separation distances on the side of the finger 404b, 405b will contract while the separation distances on the side of the finger 404a, 405a will lengthen.

In many various embodiments, the tactile sensor array can be connected to interface hardware that sends numerical data responsive to tactile information captured by the tactile sensor array to a processor. In various embodiments, this processor will process the data captured by the tactile sensor array and transform it various ways, for example into a collection of simplified data, or into a sequence of tactile image "frames" (this sequence akin to a video stream), or into highly refined information responsive to the position and movement of one or more fingers and other parts of the hand.

As to further detail of the latter example, a "frame" can refer to a 2-dimensional list, number of rows by number of columns, of tactile measurement value of every pixel in a tactile sensor array at a given instance. The time interval between one frame and the next one depends on the frame rate of the system and the number of frames in a unit time (usually frames per second). However, these features are and are not firmly required. For example, in some embodiments a tactile sensor array can not be structured as a 2-dimensional array but rather as row-aggregate and column-aggregate measurements (for example row sums and columns sums as in the tactile sensor of year 2003-2006 Apple™ Powerbooks™, row and column interference measurement data as can be provided by a surface acoustic wave or optical transmission modulation sensor as discussed later in the context of FIG. 13, etc.). Additionally, the frame rate can be adaptively-variable rather than fixed, or the frame can be segregated into a plurality regions each of which are scanned in parallel or conditionally (as taught in U.S. Pat. No. 6,570,078 and pending U.S. patent application Ser. No. 12/418,605), etc.

FIG. 5A (adapted from U.S. patent application Ser. No. 12/418,605) depicts a graphical representation of a tactile image produced by contact with the bottom surface of the most outward section (between the end of the finger and the most nearby joint) of a human finger on a tactile sensor array. In this example tactile array, there are 24 rows and 24 columns; other realizations can have fewer, more, or significantly more (hundreds or thousands) of rows and columns. Tactile measurement values of each cell are indicated by the numbers and shading in each cell. Darker cells represent cells with higher tactile measurement values. Similarly, FIG. 5B (also adapted from U.S. patent application Ser. No. 12/418,605) provides a graphical representation of a tactile image produced by contact with multiple human fingers on a tactile sensor array. In other embodiments, there can be a larger or smaller number of pixels for a given images size, resulting in varying resolution. Additionally, there can be larger or smaller area with respect to the image size resulting in a greater or lesser potential measurement area for the region of contact to be located in or move about.

FIG. 6 (adapted from U.S. patent application Ser. No. 12/418,605) depicts a realization wherein a tactile sensor array is provided with real-time or near-real-time data acquisition capabilities. The captured data reflects spatially distributed tactile measurements (such as pressure, proximity, etc.). The tactile sensory array and data acquisition stage provides this real-time or near-real-time tactile measurement data to a specialized image processing arrangement for the production of parameters, rates of change of those parameters, and symbols responsive to aspects of the hand's relationship with the tactile or other type of sensor array. In some applications, these measurements can be used directly. In other situations, the real-time or near-real-time derived parameters can be directed to mathematical mappings (such as scaling, offset, and nonlinear warpings) in real-time or near-real-time into real-time or near-real-time application-specific parameters or other representations useful for applications. In some embodiments, general purpose outputs can be assigned to variables defined or expected by the application.

The tactile sensor array employed by touch-based user interface technologies can be implemented by a wide variety of means, for example:

Pressure sensor arrays (implemented by for example—although not limited to—one or more of resistive, capacitive, piezo, optical, acoustic, or other sensing elements);

Pressure sensor arrays (implemented by for example—although not limited to—one or more of resistive, capacitive, piezo, optical, acoustic, or other sensing elements);

Proximity sensor arrays (implemented by for example—although not limited to—one or more of capacitive, optical, acoustic, or other sensing elements);

Surface-contact sensor arrays (implemented by for example—although not limited to—one or more of resistive, capacitive, piezo, optical, acoustic, or other sensing elements).

Below a few specific examples of the above are provided by way of illustration; however these are by no means limiting. The examples include:

Pressure sensor arrays comprising arrays of isolated sensors (FIG. 7);

Capacitive proximity sensors (FIG. 8);

Multiplexed LED optical reflective proximity sensors (FIG. 9);

Video camera optical reflective sensing (as taught in U.S. Pat. No. 6,570,078 and U.S. patent application Ser. Nos. 10/683,915 and 11/761,978):

direct image of hand (FIGS. 10A-10C);

image of deformation of material (FIG. 11);

Surface contract refraction/absorption (FIG. 12).

An example implementation of a tactile sensor array is a pressure sensor array. Pressure sensor arrays discussed in U.S. Pat. No. 6,570,078 and pending U.S. patent application Ser. No. 11/761,978. FIG. 7 depicts a pressure sensor array arrangement comprising a rectangular array of isolated individual two-terminal pressure sensor elements. Such two-terminal pressure sensor elements typically operate by measuring changes in electrical (resistive, capacitive) or optical properties of an elastic material as the material is compressed. In typical embodiment, each sensor element in the sensor array can be individually accessed via multiplexing arrangement, for example as shown in FIG. 7, although other arrangements are possible and provided for by the invention. Examples of prominent manufacturers and suppliers of pressure sensor arrays include Tekscan™, Inc. (307 West First Street., South Boston, Mass., 02127, www.tekscan.com), Pressure Profile Systems™ (5757 Century Boulevard, Suite 600, Los Angeles, Calif. 90045, www.pressureprofile.com), Sensor Products, Inc. (300 Madison Avenue, Madison, N.J. 07940 USA, www.sensorprod.com), and Xsensor™ Technology Corporation (Suite 111, 319-2nd Ave SW, Calgary, Alberta T2P 0C5, Canada, www.xsensor.com).

The capacitive touch sensors described above involve a capacitance change due to spatial compression of capacitive elements; there is no direct RF or electrostatic sensing of the finger itself, and the result is typically pressure sensing. Most capacitive touch sensors, however, do involve direct RF or electrostatic sensing of the finger itself, typically resulting in proximity sensing. It is also possible to create capacitive sensor arrays responsive to both proximity and pressure, for example such as the capacitive sensor arrays taught in U.S. Pat. No. 6,323,846 by Westerman.

Capacitive proximity sensors can be used in various handheld devices with touch interfaces (see for example, among many, http://electronics.howstuffworks.com/iphone2.htm, http://www.veritasetvisus.com/VVTP-12,%20Walker.pdf). Prominent manufacturers and suppliers of such sensors, both in the form of opaque touchpads and transparent touch screens, include Balda™ AG (Bergkirchener Str. 228, 32549 Bad Oeynhausen, Del., www.balda.de), Cypress™ (198 Champion Ct., San Jose, Calif. 95134, www.cypress.com), and Synaptics™ (2381 Bering Dr., San Jose, Calif. 95131, www.synaptics.com). In such sensors, the region of finger contact is detected by variations in localized capacitance resulting from capacitive proximity effects induced by an overlapping or otherwise nearly-adjacent finger. More specifically, the electrical field at the intersection of orthogonally-aligned conductive buses is influenced by the vertical distance or gap between the surface of the sensor array and the skin surface of the finger. Such capacitive proximity sensor technology is low-cost, reliable, long-life, stable, and can readily be made transparent. FIG. 8 (adapted from http://www.veritasetvisus.com/VVTP-12.%20Walker.pdf with slightly more functional detail added) shows a popularly accepted view of a typical cell phone or PDA capacitive proximity sensor implementation. Capacitive sensor arrays of this type can be highly susceptible to noise and various shielding and noise-suppression electronics and systems techniques can need to be employed for adequate stability, reliability, and performance in various electric field and electromagnetically noisy environments. In some embodiments of a touch-based user interface, the present invention can use the same spatial resolution as current capacitive proximity touchscreen sensor arrays. In other embodiments of the present invention, a higher spatial resolution is advantageous.

Forrest M. Mims is credited as showing that an LED can be used as a light detector as well as a light emitter. Recently, light-emitting diodes have been used as a tactile proximity sensor array—for example, as taught in U.S. Pat. No. 7,598,949 by Han and depicted in the associated video available at http://cs.nyu.edu/~jhan/ledtouch/index.html). Such tactile proximity array implementations typically need to be operated in a darkened environment (as seen in the video in the above web link). In one embodiment provided for by the invention, each LED in an array of LEDs can be used as a photodetector as well as a light emitter, although a single LED can either transmit or receive information at one time. Each LED in the array can sequentially be selected to be set to be in receiving mode while others adjacent to it are placed in light emitting mode. A particular LED in receiving mode can pick up reflected light from the finger, provided by said neighboring illuminating-mode LEDs. FIG. 9 depicts an implementation. The invention provides for additional systems and methods for not requiring darkness in the user environment in order to operate the LED array as a tactile proximity sensor. In one embodiment, potential interference from ambient light in the surrounding user environment can be limited by using an opaque pliable or elastically deformable surface covering the LED array that is appropriately reflective (directionally, amorphously, etc. as can be advantageous in a particular design) on the side facing the LED array. Such a system and method can be readily implemented in a wide variety of ways as is clear to one skilled in the art. In another embodiment, potential interference from ambient light in the surrounding user environment can be limited by employing amplitude, phase, or pulse width modulated circuitry or software to control the underlying light emission and receiving process. For example, in an implementation the LED array can be configured to emit modulated light modulated at a particular carrier frequency or variational waveform and respond to only modulated light signal components extracted from the received light signals comprising that same carrier frequency or variational waveform. Such a system and method can be readily implemented in a wide variety of ways as is clear to one skilled in the art.

An important special case of this is the use of OLED arrays such as those used in OLED displays increasingly deployed in cellphones, smartphones, and Personal Digital Assistants ("PDAs") manufactured by Samsung, Nokia, LG, HTC, Phillips, Sony and others. As taught in pending U.S. patent application Ser. Nos. 13/452,461, 13/180,345 and 13/547,024, such an arrangement can be implemented in a number of ways to provide a high-resolution optical tactile sensor for touch-based user interfaces. Color OLED array displays are of particular interest, in general and as pertaining to the present invention, because:

- They can be fabricated (along with associated electrical wiring conductors) via printed electronics on a wide variety of surfaces such as glass, Mylar, plastics, paper, etc.;
- Leveraging some such surface materials, they can be readily bent, printed on curved surfaces, etc.;
- They can be transparent (and be interconnected with transparent conductors);
- Leveraging such transparency, they can be: stacked vertically, used as an overlay element atop an LCD or other display, and used as an underlay element between an LCD and its associated backlight.

As taught in U.S. Pat. No. 8,125,559 and pending U.S. patent application Ser. Nos. 13/452,461, 13/180,345 and 13/547,024, leveraging this in various ways, in accordance with embodiments of the invention, array of inorganic-LEDs, OLEDs, or related optoelectronic devices is configured to perform functions of two or more of:

- a visual image display (graphics, image, video, GUI, etc.),
- a (lensless imaging) camera (as taught in U.S. Pat. Nos. 8,284,290 and 8,305,480,
- a tactile user interface (touch screen),
- a proximate gesture user interface.

As taught in pending U.S. patent application Ser. Nos. 13/452,461, 13/180,345 and 13/547,024, such arrangements further advantageously allow for a common processor to be used for both a display and a touch-based user interface. Further, the now widely-popular RF capacitive matrix arrangements used in contemporary multi-touch touchscreen is fully replaced with an arrangement involving far fewer electronic components.

Another type of optical tactile sensor approach arranged to serve as both a display and a tactile sensor is taught in U.S. Pat. No. 8,049,739 by Wu et al., which uses a deformable back-lit LCD display comprising internally reflective elements and photosensitive elements associated with the LCD display responsive to the reflective light.

Use of video cameras for gathering control information from the human hand in various ways is discussed in U.S. Pat. No. 6,570,078 and Pending U.S. patent application U.S. Ser. No. 10/683,915. Here the camera image array is employed as a touch-based user interface tactile sensor array. Images of the human hand as captured by video cameras can be used as an enhanced multiple-parameter interface responsive to hand positions and gestures, for example as taught in U.S. patent application U.S. Ser. No. 10/683,915 Pre-Grant-Publication 2004/0118268 (paragraphs [314], [321]-[332], [411], [653], both stand-alone and in view of [325], as well as [241]-[263]). FIGS. 10A and 10B depict single camera implementations. As taught in section 2.1.7.2 of both U.S. Pat. No. 6,570,078 and pending U.S. patent application Ser. No. 10/683,915, two or more video cameras can be used in orthogonal or stereoscopic arrangements to capture hand expressions within 3-space regions. FIG. 10C depicts a two camera implementation. As taught in the aforementioned references, a wide range of relative camera sizes and positions with respect to the hand are provided for, considerably generalizing the arrangements shown in FIGS. 10A-10C.

In another video camera tactile controller embodiment, a flat or curved transparent or translucent surface or panel can be used as sensor surface. When a finger is placed on the transparent or translucent surface or panel, light applied to the opposite side of the surface or panel reflects light in a distinctly different manner than in other regions where there is no finger or other tactile contact. The image captured by an associated video camera will provide gradient information responsive to the contact and proximity of the finger with respect to the surface of the translucent panel. For example, the parts of the finger that are in contact with the surface will provide the greatest degree of reflection while parts of the finger that curve away from the surface of the sensor provide less reflection of the light. Gradients of the reflected light captured by the video camera can be arranged to produce a gradient image that appears similar to the multilevel quantized image captured by a pressure sensor. By comparing changes in gradient, changes in the position of the finger and pressure applied by the finger can be detected. FIG. 11 depicts an implementation.

Section 2.1.7.2 of both U.S. Pat. No. 6,570,078 and pending U.S. patent application Ser. No. 10/683,915 also teach that two or more video cameras can be used and can be used in conjunction with at least a pressure-sensor array touchpad sensor. Further development of these and related multiple sensor arrangements are considered in the final technical section of the present application.

FIGS. 12A-12B depict an implementation of an arrangement comprising a video camera capturing the image of a deformable material whose image varies according to applied pressure. In the example of FIG. 12A, the deformable material serving as a touch interface surface can be such that its intrinsic optical properties change in response to deformations, for example by changing color, index of refraction, degree of reflectivity, etc. In another approach, the deformable material can be such that exogenous optic phenomena are modulated in response to the deformation. As an example, the arrangement of FIG. 12B is such that the opposite side of the deformable material serving as a touch interface surface comprises deformable bumps which flatten out against the rigid surface of a transparent or translucent surface or panel. The diameter of the image as seen from the opposite side of the transparent or translucent surface or panel increases as the localized pressure from the region of hand contact increases. Such an approach was created by Professor Richard M. White at U.C. Berkeley in the 1980's.

FIG. 13 depicts an optical or acoustic diffraction or absorption arrangement that can be used for contact or pressure sensing of tactile contact. Such a system can employ, for example light or acoustic waves. In this class of methods and systems, contact with or pressure applied onto the touch surface causes disturbances (diffraction, absorption, reflection, etc.) that can be sensed in various ways. The light or acoustic waves can travel within a medium comprised by or in mechanical communication with the touch surface. A slight variation of this is where surface acoustic waves travel along the surface of, or interface with, a medium comprised by or in mechanical communication with the touch surface.

FIG. 14 shows a finger image wherein rather than a smooth gradient in pressure or proximity values there is radical variation due to non-uniformities in offset and scaling terms among the sensors.

FIG. 15 shows a sensor-by-sensor compensation arrangement for such a situation. A structured measurement process applies a series of known mechanical stimulus values (for example uniform applied pressure, uniform simulated proximity, etc.) to the tactile sensor array and measurements are made for each sensor. Each measurement data point for each sensor is compared to what the sensor should read and a piecewise-linear correction is computed. In an embodiment, the coefficients of a piecewise-linear correction operation for each sensor element are stored in a file. As the raw data stream is acquired from the tactile sensor array, sensor-by-sensor the corresponding piecewise-linear correction coefficients are obtained from the file and used to invoke a piecewise-linear correction operation for each sensor measurement. The value resulting from this time-multiplexed series of piecewise-linear correction operations forms an outgoing "compensated" measurement data stream. Such an arrangement is employed, for example, as part of the aforementioned Tekscan™ resistive pressure sensor array products.

Additionally, the macroscopic arrangement of sensor elements can introduce nonlinear spatial warping effects. As an example, various manufacturer implementations of capacitive proximity sensor arrays and associated interface electronics are known to comprise often dramatic nonlinear spatial warping effects. FIG. 16 (adapted from http://labs.moto.com/diy-touchscreen-analysis/) depicts the comparative performance of a group of contemporary handheld devices wherein straight lines were entered using the surface of the respective touchscreens. A common drawing program was used on each device, with widely-varying type and degrees of nonlinear spatial warping effects clearly resulting. For simple gestures such as selections, finger-flicks, drags, spreads, etc., such nonlinear spatial warping effects introduce little consequence. For more precision applications, such nonlinear spatial warping effects introduce unacceptable performance. Close study of FIG. 16 shows different types of responses to tactile stimulus in the direct neighborhood of the relatively widely-spaced capacitive sensing nodes versus tactile stimulus in the boundary regions between capacitive sensing nodes. Increasing the number of capacitive sensing nodes per unit area can reduce this, as can adjustments to the geometry of the capacitive sensing node conductors. In many cases improved performance can be obtained by introducing or more carefully implementing interpolation mathematics.

Overview of 3D, 6D, and Other Capabilities of HDTP Technology User Interface Technology Before providing details specific to the present invention, some embodiments of HDTP technology is provided. This will be followed by a summarizing overview of HDTP technology. With the exception of a few minor variations and examples, the material presented in this overview section is drawn from U.S. Pat. No. 6,570,078, pending U.S. patent application Ser. Nos. 11/761,978, 12/418,605, 12/502,230, 12/541,948, 12/724,413, 13/026,248, and related pending U.S. patent applications and is accordingly attributed to the associated inventors.

FIGS. 17A-17F (adapted from U.S. patent application Ser. No. 12/418,605 and described in U.S. Pat. No. 6,570,078) illustrate six independently adjustable degrees of freedom of touch from a single finger that can be simultaneously measured by the HDTP technology. The depiction in these figures is from the side of the touchpad. FIGS. 17A-17C show actions of positional change (amounting to applied pressure in the case of FIG. 17C) while FIGS. 17D-17F show actions of angular change. Each of these can be used to control a user interface parameter, allowing the touch of a single fingertip to control up to six simultaneously-adjustable quantities in an interactive user interface as shown in FIG. 18.

Each of the six parameters listed above can be obtained from operations on a collection of sums involving the geometric location and tactile measurement value of each tactile measurement sensor. Of the six parameters, the left-right geometric center, forward-back geometric center, and clockwise-counterclockwise yaw rotation can be obtained from binary threshold image data. The average downward pressure, roll, and pitch parameters are in some embodiments beneficially calculated from gradient (multi-level) image data. One remark is that because binary threshold image data is sufficient for the left-right geometric center, forward-back geometric center, and clockwise-counterclockwise yaw rotation parameters, these also can be discerned for flat regions of rigid non-pliable objects, and thus the HDTP technology thus can be adapted to discern these three parameters from flat regions with striations or indentations of rigid non-pliable objects.

Additionally, as taught in U.S. patent application Ser. No. 12/418,605, a wide range of richly-parameterized multi-touch configurations are supported by the HDTP technology. FIG. 19 depicts example multi-touch positions and gestures involving two fingers that are supported by the HDTP technology, and FIG. 20 depicts various individual and compound images associated with touch by various portions of the human hand whose recognition and classification are supported by the HDTP technology.

BRIEF DESCRIPTION OF THE DRAWINGS

The above and other aspects, features and advantages of the present invention will become more apparent upon consideration of the following description of preferred embodiments taken in conjunction with the accompanying drawing figures.

DETAILED DESCRIPTION

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

In the following description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention.

Despite the many popular touch interfaces and gestures in contemporary information appliances and computers, there remains a wide range of additional control capabilities that can yet be provided by further enhanced user interface technologies. A number of enhanced touch user interface features are described in U.S. Pat. Nos. 6,570,078 and 8,169,414 as well as pending U.S. patent application Ser. Nos. 11/761,978, 12/418,605, 12/502,230, 12/541,948, and related pending U.S. patent applications. These patents and patent applications also address popular contemporary gesture and touch features. The enhanced user interface features taught in these patents and patent applications, together with popular contemporary gesture and touch features, can be rendered by the "High Dimensional Touch Pad" (HDTP) technology taught in those patents and patent applications.

Figure 1A:
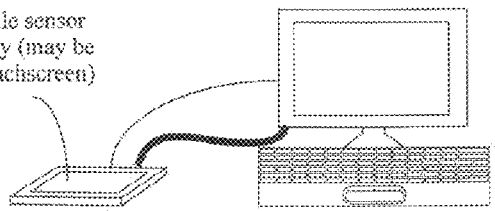
FIGS. 1A-1G depict a number of arrangements and embodiments employing touch-based user interface technologies.
Figure 1B:
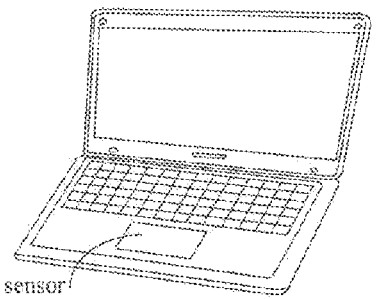
Figure 1C:
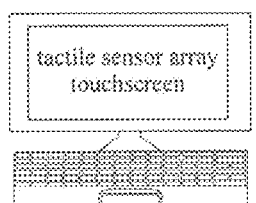
Figure 1D:
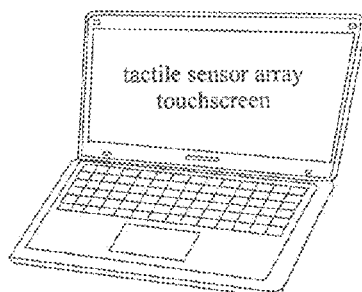
Figure 1E:
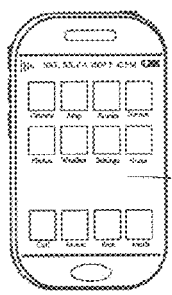
Figure 1F:
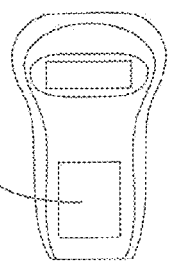
Figure 1G:
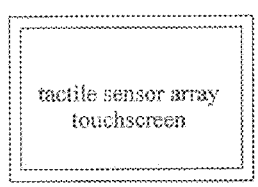
Figure 2A:
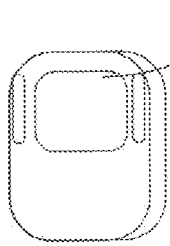
FIGS. 2A-2E and FIGS. 3A-3B depict various integrations of an HDTP into the back of a conventional computer mouse as taught in U.S. Pat. No. 7,557,797 and in pending U.S. patent application Ser. No. 12/619,678.
Figure 2B:
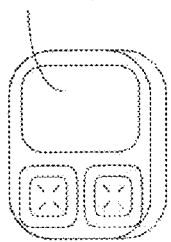
Figure 2C:
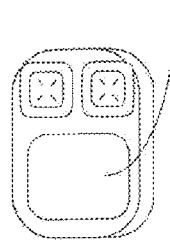
Figure 2D:
Figure 2E:
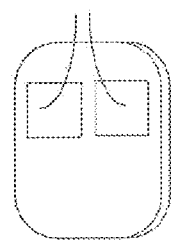
Figure 3A:
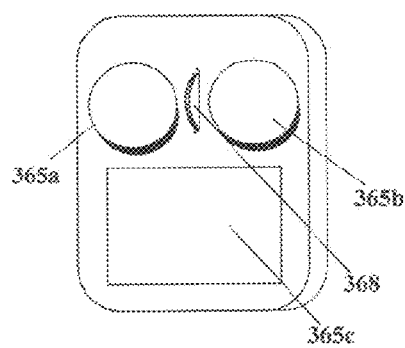
Figure 3B:
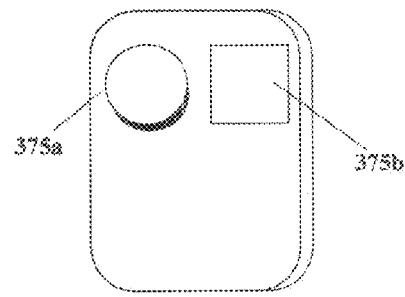
Figure 4:
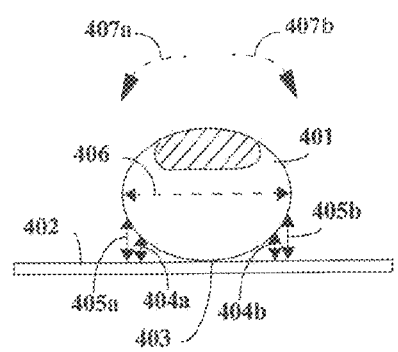
FIG. 4 illustrates the side view of a finger lightly touching the surface of a tactile sensor array.
Figure 5A:
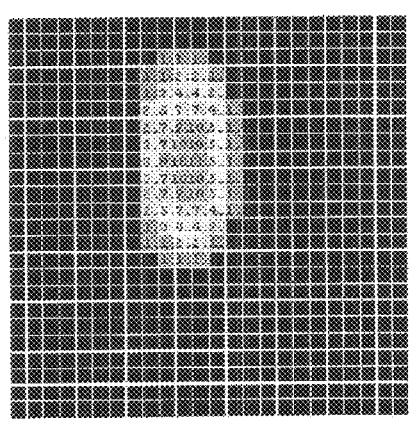
FIG. 5A is a graphical representation of a tactile image produced by contact of a human finger on a tactile sensor array.
Figure 5B:
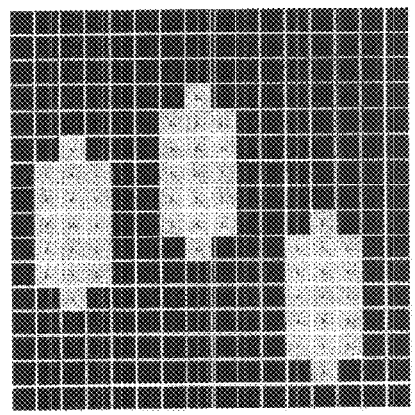
FIG. 5B provides a graphical representation of a tactile image produced by contact with multiple human fingers on a tactile sensor array.
Figure 6:
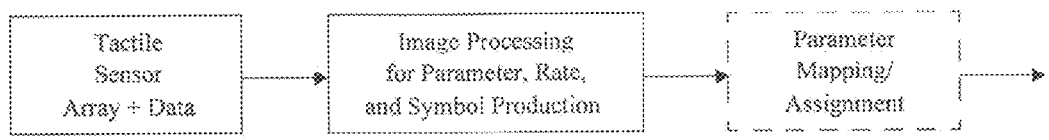
FIG. 6 depicts a signal flow in an example touch-based user interface implementation.
Figure 7:
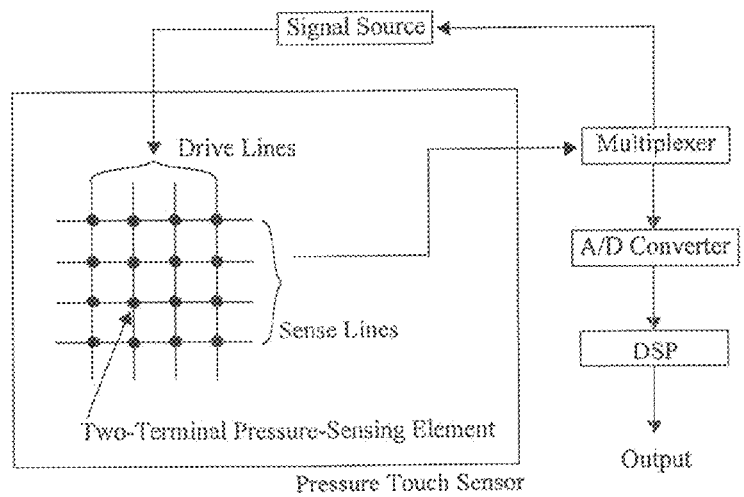
FIG. 7 depicts a pressure sensor array arrangement.
Figure 8:
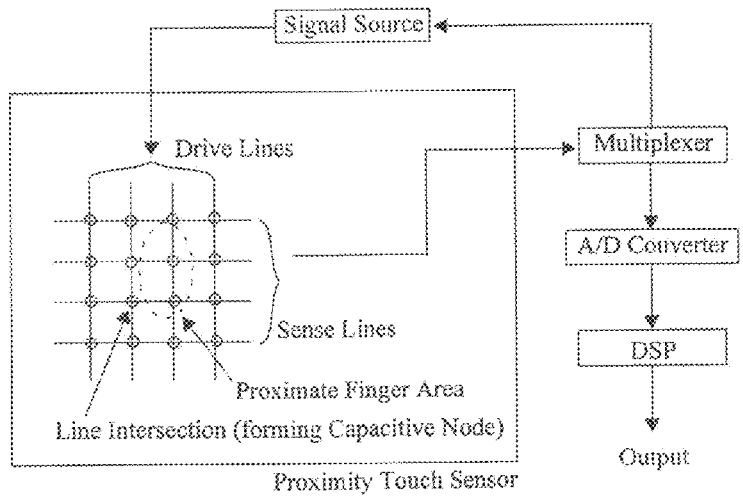
FIG. 8 depicts a popularly accepted view of a typical cell phone or PDA capacitive proximity sensor implementation.
Figure 9:
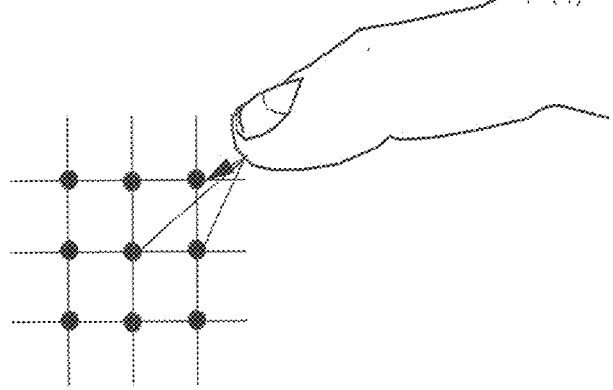
FIG. 9 depicts an implementation of a multiplexed LED array acting as a reflective optical proximity sensing array.
Figure 10A:
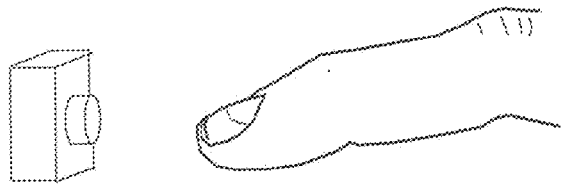
FIGS. 10A-10C depict camera implementations for direct viewing of at least portions of the human hand, wherein the camera image array is employed as an touch-based user interface tactile sensor array.
Figure 10B:
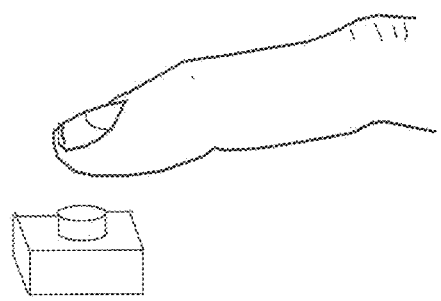
Figure 10C:
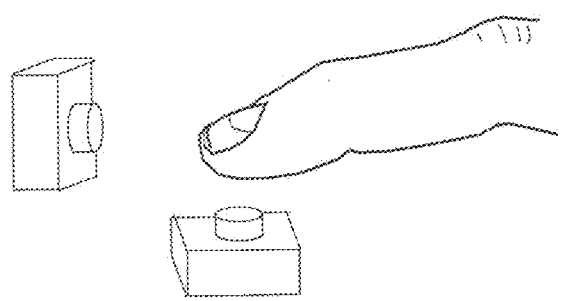
Figure 11:
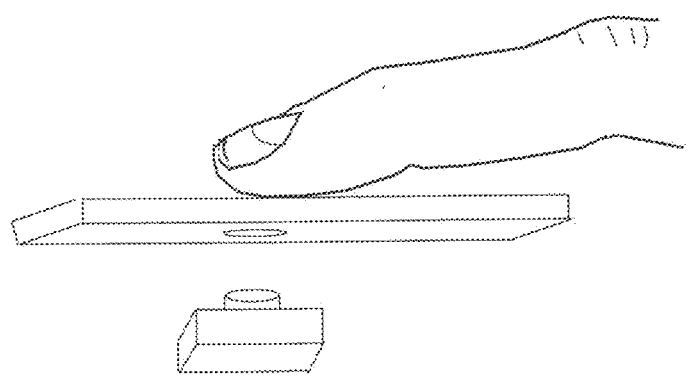
FIG. 11 depicts an embodiment of an arrangement comprising a video camera capturing the image of the contact of parts of the hand with a transparent or translucent surface.
Figure 12A:
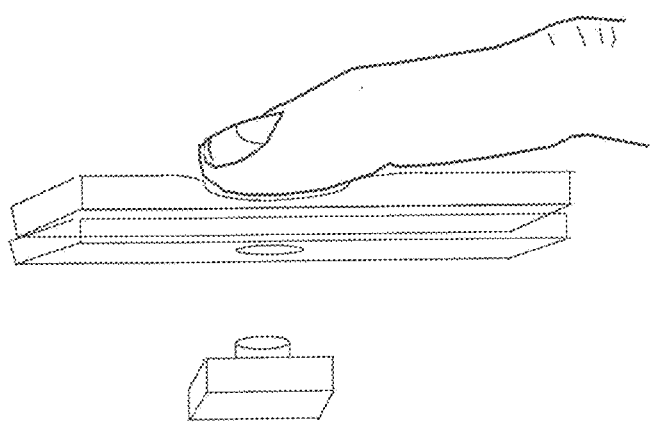
FIGS. 12A-12B depict an implementation of an arrangement comprising a video camera capturing the image of a deformable material whose image varies according to applied pressure.
Figure 12B:
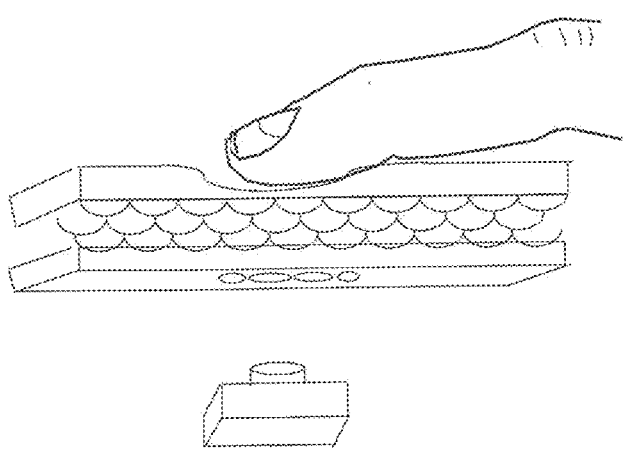
Figure 13:
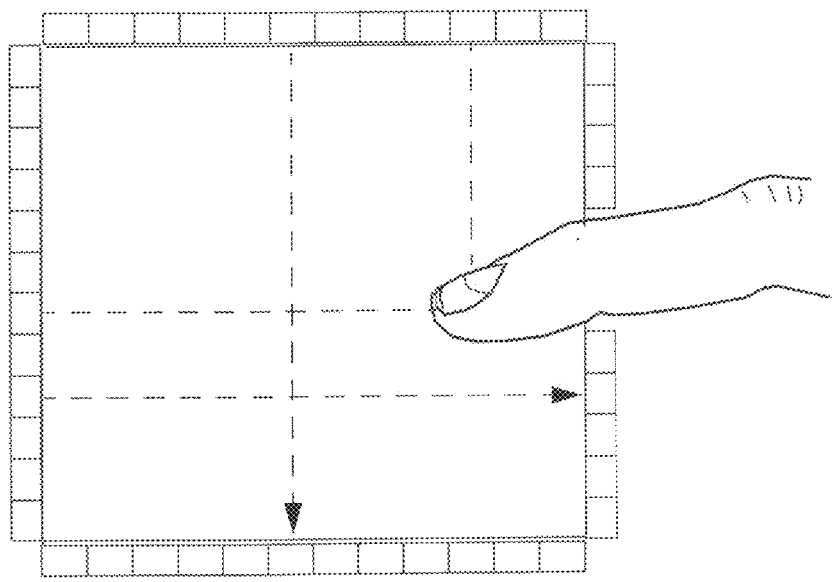
FIG. 13 depicts an implementation of an optical or acoustic diffraction or absorption arrangement that can be used for contact or pressure sensing of tactile contact.
Figure 14:
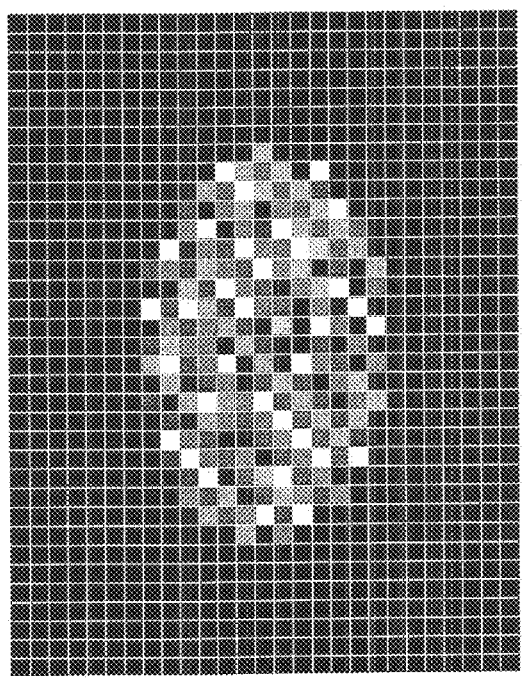
FIG. 14 shows a finger image wherein rather than a smooth gradient in pressure or proximity values there is radical variation due to non-uniformities in offset and scaling terms among the sensors.
Figure 15:
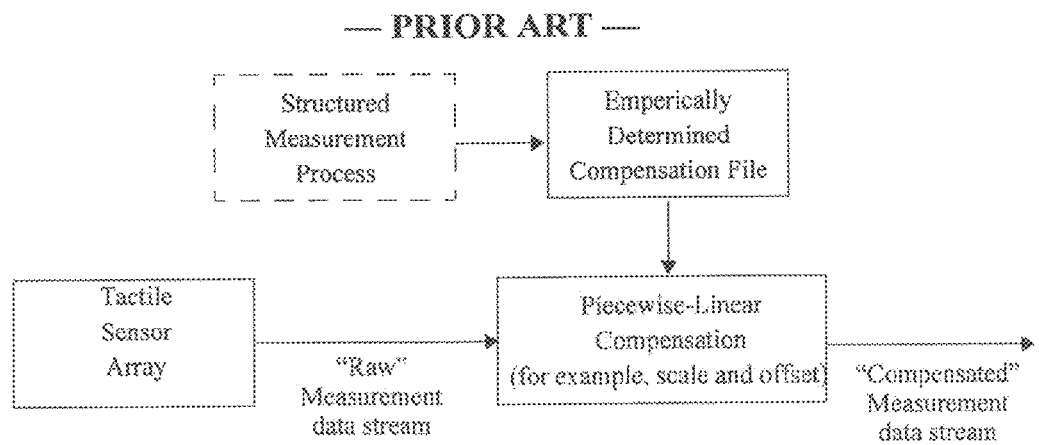
FIG. 15 shows a sensor-by-sensor compensation arrangement.
Figure 16:
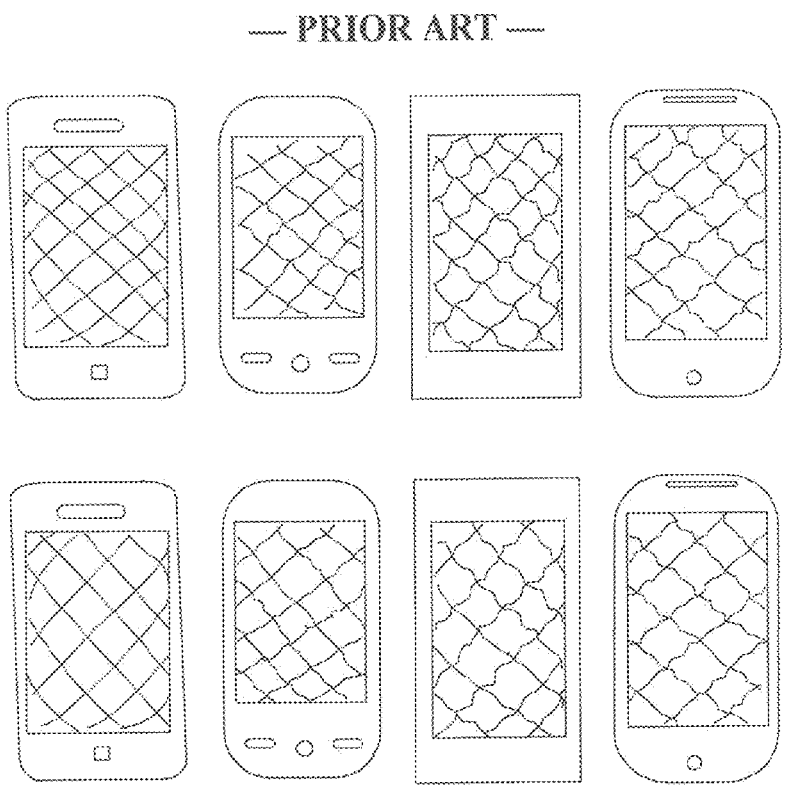
FIG. 16 (adapted from http://labs.moto.com/diy-touch-screen-analysis/) depicts the comparative performance of a group of contemporary handheld devices wherein straight lines were entered using the surface of the respective touchscreens.
Figure 17A:
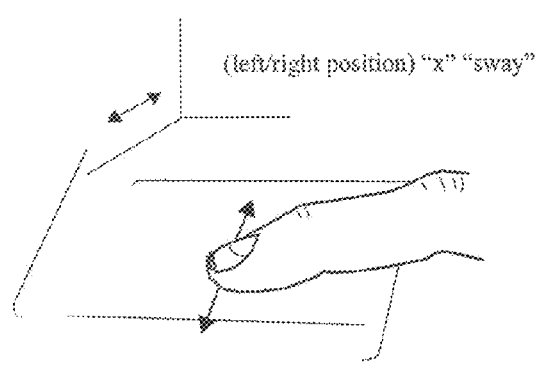
FIGS. 17A-17F illustrate the six independently adjustable degrees of freedom of touch from a single finger that can be simultaneously measured by the HDTP technology.
Figure 17D:
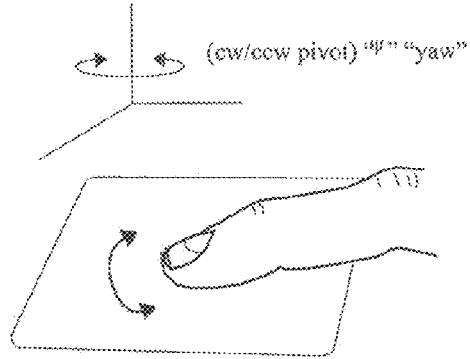
Figure 17B:
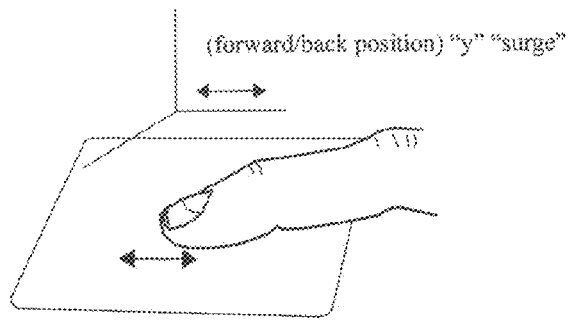
Figure 17E:
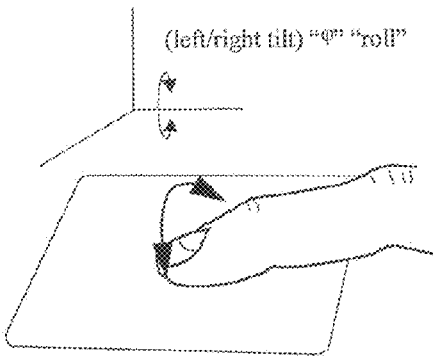
Figure 17C:
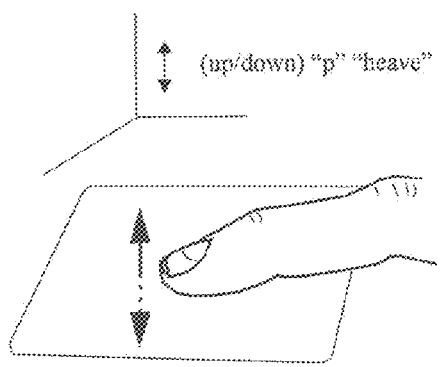
Figure 17F:
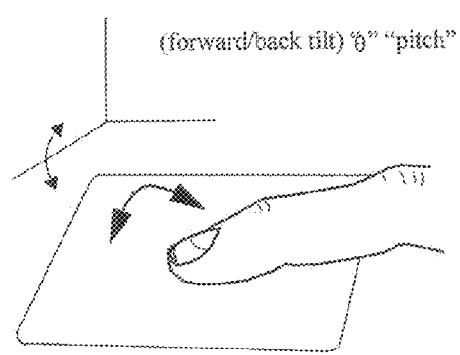
Figure 18:
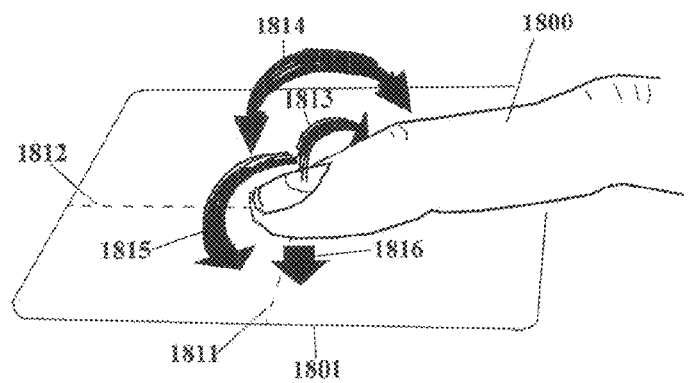
FIG. 18 suggests general ways in which two or more of these independently adjustable degrees of freedom adjusted at once as can be measured by the HDTP technology.
Figure 19:
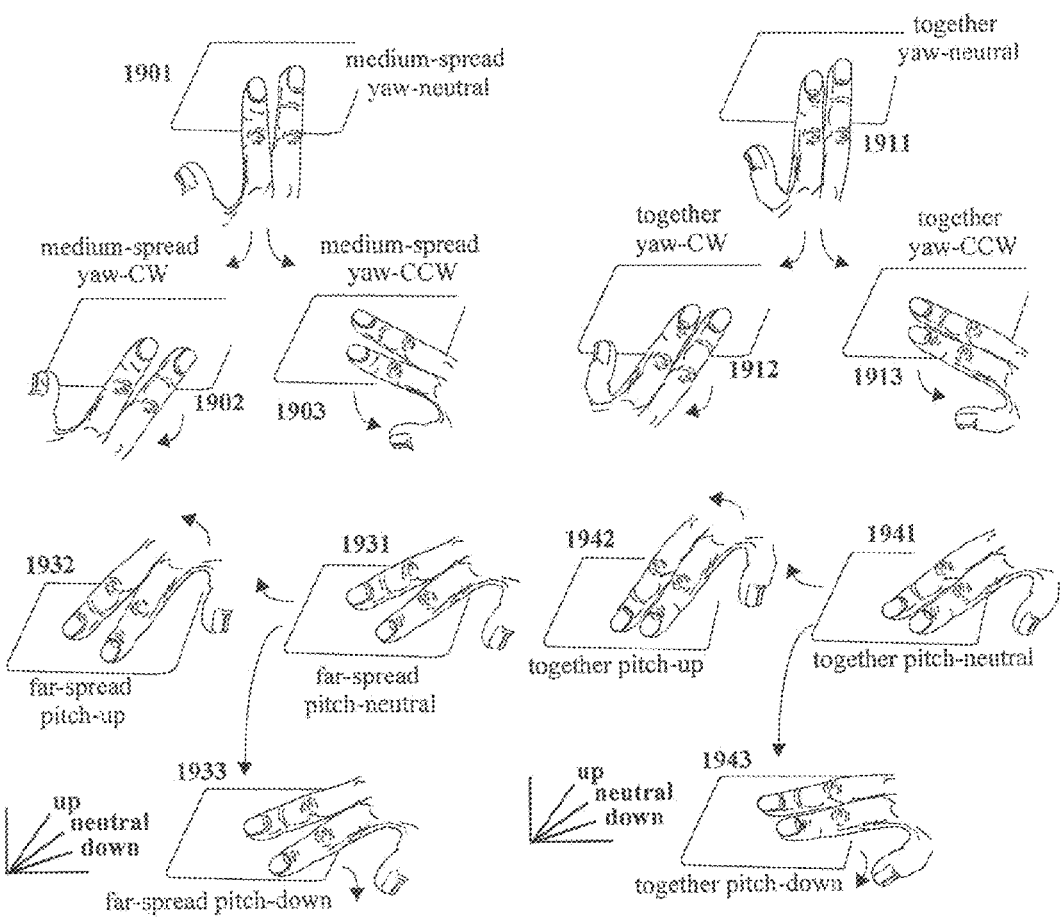
FIG. 19 demonstrates a few two-finger multi-touch postures or gestures from the many that can be recognized by HTDP technology.
Figure 20:
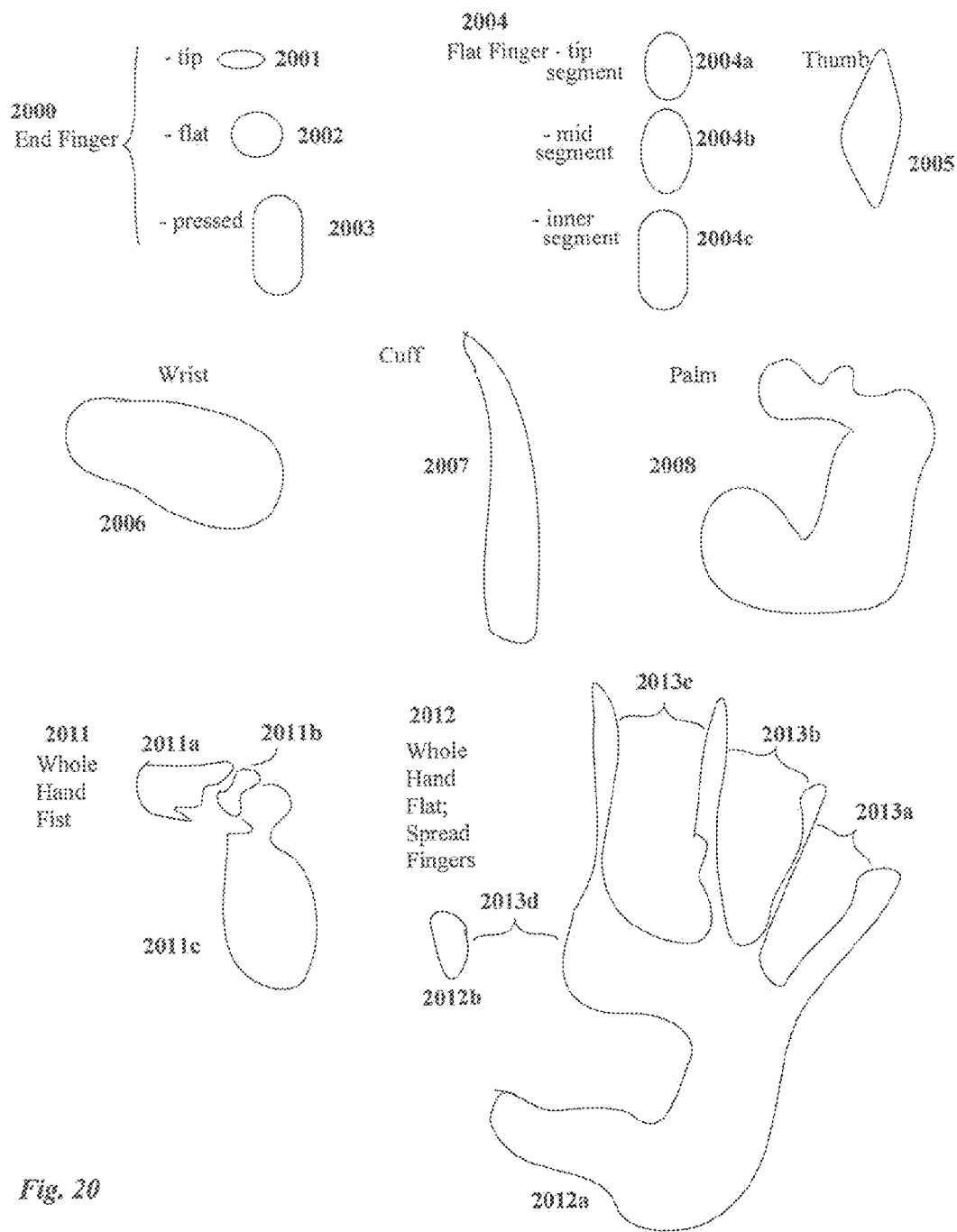
FIG. 20 illustrates the pressure profiles for a number of example hand contacts with a tactile-sensor array as can be recognized by the HDTP technology.
Figure 21A:
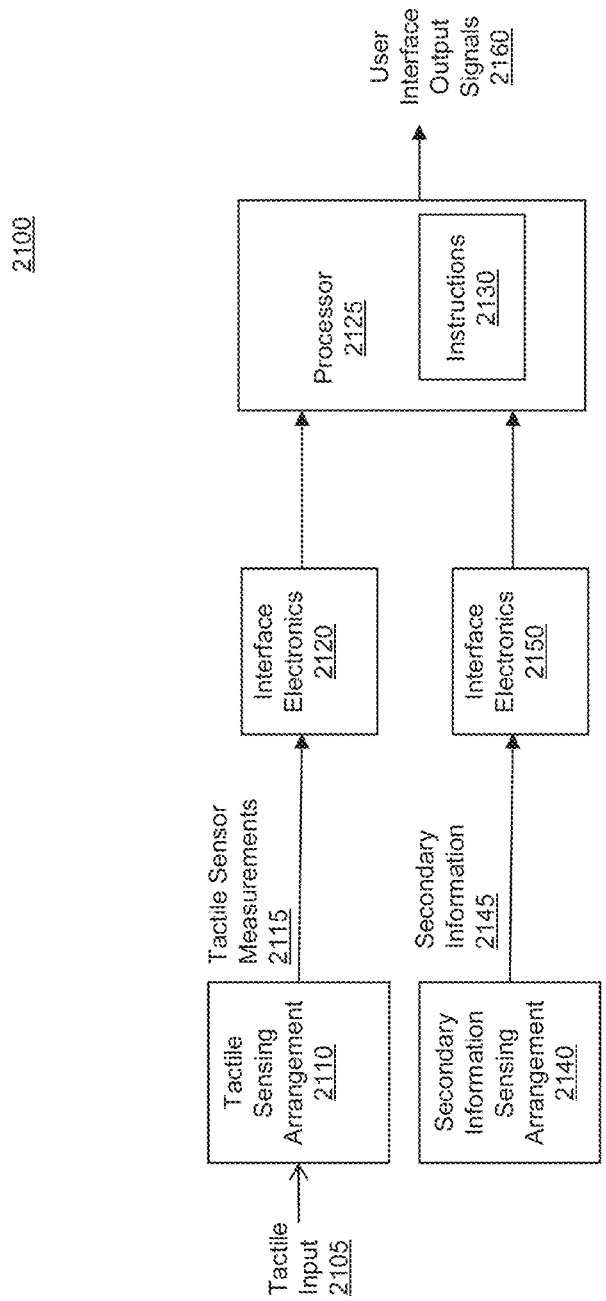
FIG. 21A depicts a system for providing multiple sensor configuration implementations of touch-based user interfaces, including those supporting gestures and HDTP (High-Dimensional Touch Pad) features according to an embodiment of the invention.

FIG. 21A depicts a system 2100 for providing multiple sensor configuration implementations of touch-based user interfaces, including those supporting gestures and HDTP (High-Dimensional Touch Pad) features according to an embodiment of the invention. System 2100 implements a user interface that receives a tactile input 2105, such as by touch contact by at least one finger of a human user. A tactile sensing arrangement 2110 generates tactile sensing measurements 2105 in response to the tactile input 2105 and provides tactile sensing measurements 2105 via interface electronics 2120 to a computational processor 2125. A secondary information sensing arrangement 2140 generates secondary information 2145 and provides the secondary information 2145 via interface electronics 2120 to a computational processor 2125. The processor 2125 stores instructions 2130 in memory, which upon execution, use both the tactile sensing measurements 2105 and the secondary information 2145 to generate user interface output signals 2160.

In one embodiment, each of the tactile sensing measurements 2105 and the secondary information 2145 are separately processed and the results of each are then combined and/or selectively chosen to produce improved performance. In another embodiment, both of tactile sensing measurements 2105 and the secondary information 2145 are processed together, for example, to produce improved performance.

Embodiment: Secondary Information Sensing Arrangement 2140 Includes a Tactile Sensor In some embodiments (see, e.g., embodiments discussed in FIGS. 21B and 21C), the secondary information sensing arrangement 2140 is a tactile sensing arrangement and generates secondary tactile sensing measurements (as secondary information 2145) in response to the tactile input 2105. For example, in one embodiment, the secondary information sensing arrangement 2140 includes a capacitive tactile sensor and the secondary information sensing arrangement 2140 includes an optical touch sensor. In another embodiment, the secondary information sensing arrangement 2140 includes an optical touch sensor and the secondary information sensing arrangement 2140 includes a capacitive tactile sensor. In FIGS. 21B-C, 22C-22D and 23C-23D, the top sensor represents the sensor that is nearest to the human hand (or other object providing tactile input), and the bottom sensor represents the sensor that is farther from the human hand.

Figure 21B:
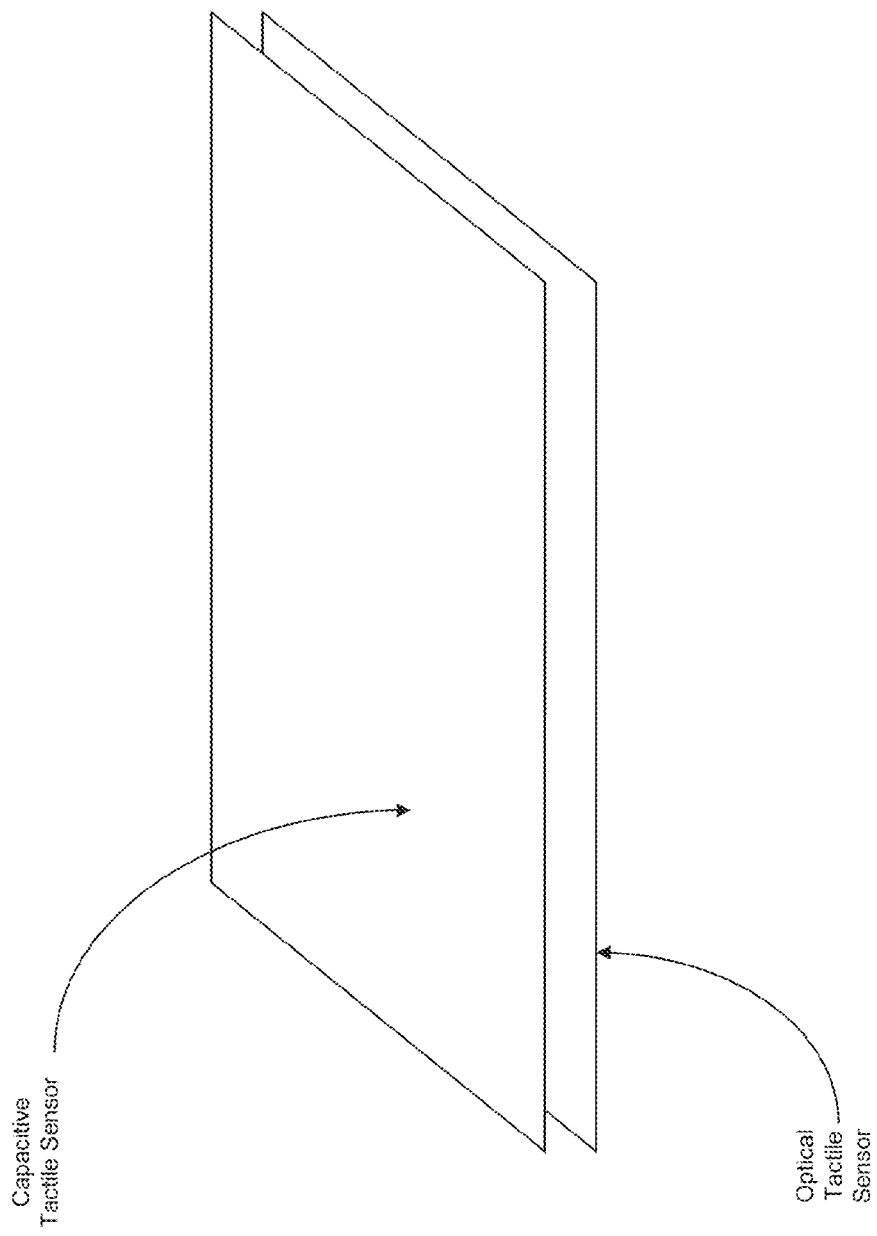
FIG. 21B depicts an exemplary arrangement wherein a capacitive tactile sensor is configured atop an optical tactile sensor.

FIG. 21B depicts an exemplary arrangement wherein a capacitive tactile sensor (representing the sensor that is nearest the human hand) is configured atop an optical tactile sensor (representing the sensor that is farther from the human hand). Typically the capacitive tactile sensor is advantageously transparent (to facilitate optical imaging of the finger for the optical touch sensor and/or to implement an overlay touch sensor for a touchscreen). For example, should both the capacitive tactile sensor and optical tactile sensor be transparent, the entire arrangement can be overlaid upon a display (for example and LCD or OLED display) and serve as a touch screen. Alternatively, should the optical tactile sensor be implemented with an OLED display that is arranged to serve as both a display and a tactile sensor, as taught in pending U.S. patent application Ser. Nos. 13/452,461, 13/180,345 and 13/547,024, then the entire arrangement can serve as a touch screen if the capacitive tactile sensor and optical tactile sensor are transparent. Similarly, should the optical tactile sensor comprise another approach arranged to serve as both a display and a tactile sensor, such as that taught in U.S. Pat. No. 8,049,739 by Wu et al., again the entire arrangement can serve as a touch screen if the capacitive tactile sensor and optical tactile sensor are transparent.

Figure 21C:
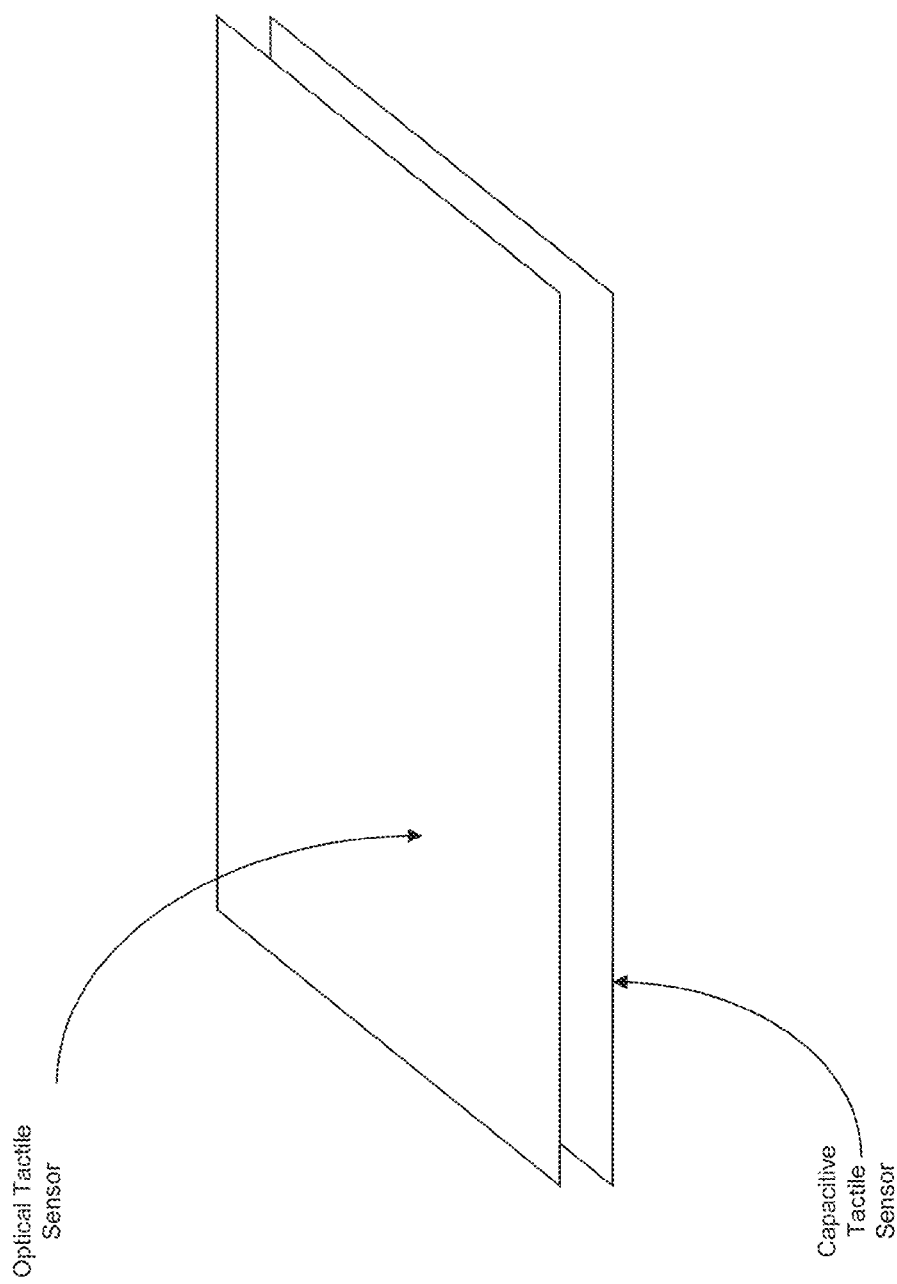
FIG. 21C depicts an exemplary arrangement wherein an optical tactile sensor is configured atop a capacitive tactile sensor.

FIG. 21C depicts an exemplary arrangement wherein an optical tactile sensor is configured atop a capacitive tactile sensor. For some types of capacitive touch sensors, for example those wherein the capacitance is changed due to spatial compression of capacitive elements, there is no direct RF or electrostatic sensing of the finger itself—for these situations the optical sensor need not be non-shielding or "transparent" to RF or electrostatic fields. For most capacitive touch sensors, however, direct RF or electrostatic sensing of the finger itself is involved—for these situations the optical sensor typically must be to at least some degree non-shielding or "transparent" to RF or electrostatic fields. For some types of optical touch sensors, such as variations of that taught in U.S. Pat. No. 8,049,739 by Wu et al., no optical imaging of the finger is required so the optical touch sensor can be opaque. However, should the capacitive tactile sensor be transparent and the optical touch sensor also serve as a touchscreen (for example employing U.S. Pat. No. 8,049,739 by Wu et al. or as taught in pending U.S. patent application Ser. Nos. 13/452,461, 13/180,345 and 13/547, 024), the entire arrangement can be overlaid upon a display (for example and LCD or OLED display) and serve as a touch screen. Further, should both the optical tactile sensor and the capacitive tactile sensor be transparent, the entire arrangement can be overlaid upon a display (for example and LCD or OLED display) and serve as a touch screen.

In either of the approaches associated with FIG. 21B and FIG. 21C, various touch user interface hardware arrangements can be connected to each of the optical tactile sensor and the capacitive tactile sensor. As explained later, there are various structural approaches to processing the sensor measurements to provide user interface output signals. In one embodiment, each of the optical tactile sensor measurements and the capacitive tactile sensor measurements are separately processed and the results of each are then combined and/or selectively chosen to produce improved performance. In another embodiment, both of the optical tactile sensor measurements and the capacitive tactile sensor measurements are processed together to produce improved performance.

Embodiment: Secondary Information Sensing Arrangement 2140 Includes One Camera

Some embodiments of the present invention additionally provide for the combination of at least one tactile sensor (as tactile sensing arrangement 2110) and at least one video camera (as secondary information sensing arrangement 2140) to be used as touch-based user interface arrangement. This can be done in a large variety of physical arrangements, hardware arrangements, measurement processing arrangements, and output signal calculation arrangements as will be indicated in the provided examples to follow. For example, as explained later, there are various structural approaches to processing the tactile sensor measurements and video camera signals to provide user interface output signals. In one structural approach, each of tactile sensor measurements and video camera signal(s) are separately processed and the results of each are then combined and/or selectively chosen to produce user interface output signals. In another structural approach, both of the tactile sensor measurements and video camera signal(s) are processed together to produce user interface output signals.

Figure 22A:
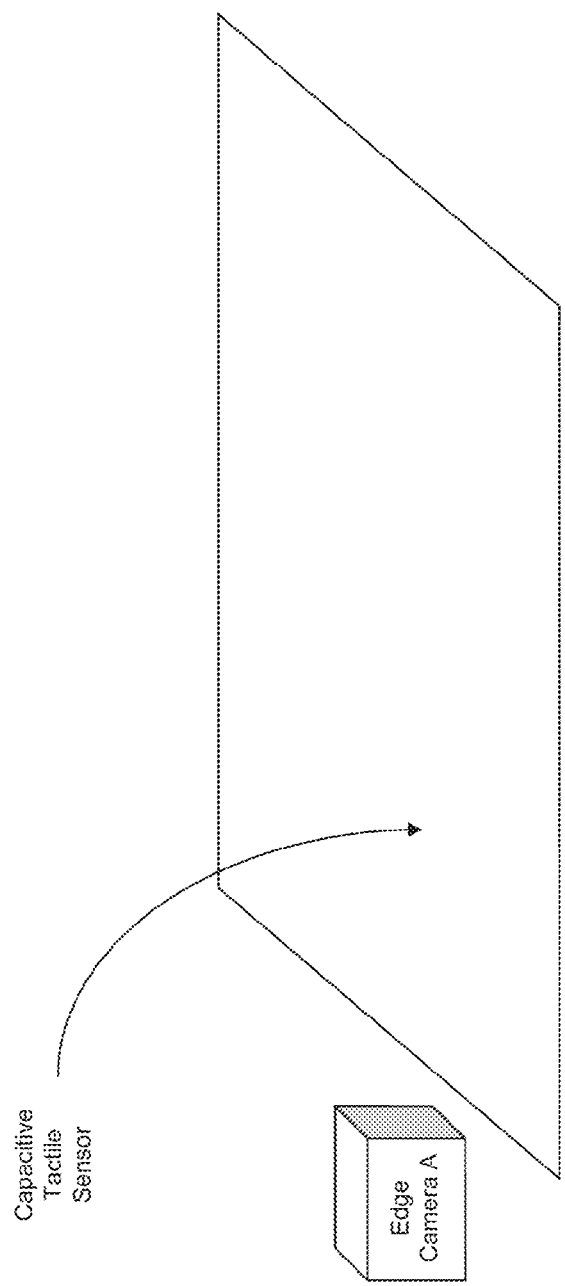
FIG. 22A depicts an example touch-based user interface arrangement comprising a single video camera situated together with a capacitive tactile sensor.
Figure 22B:
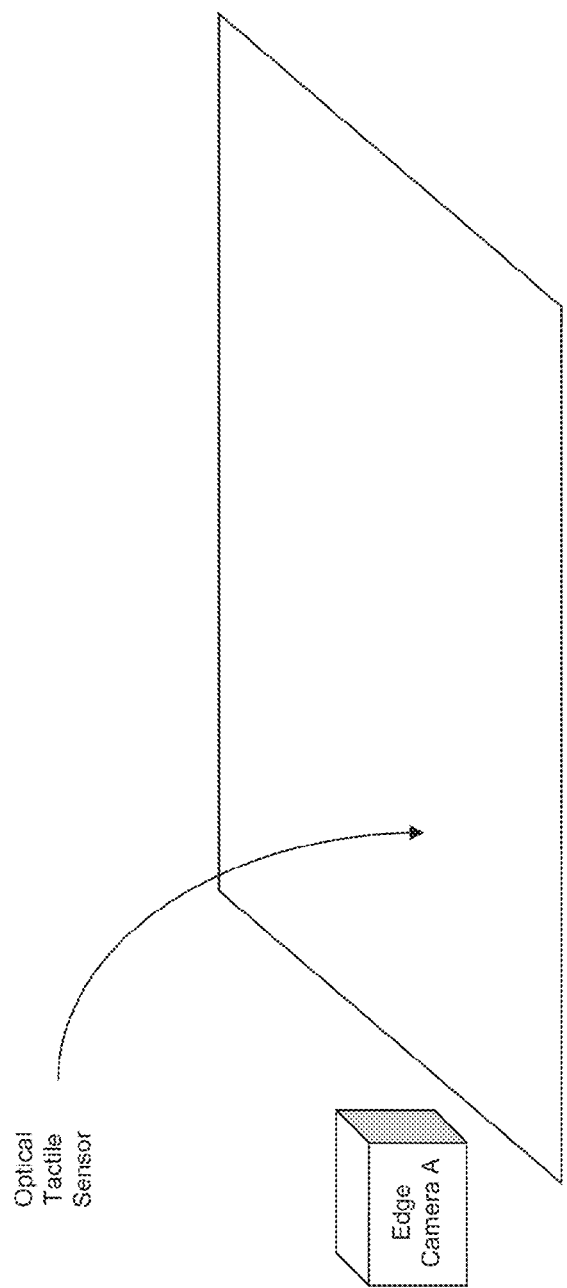
FIG. 22B depicts an example touch-based user interface arrangement comprising a video camera situated together with an optical tactile sensor.
Figure 22C:
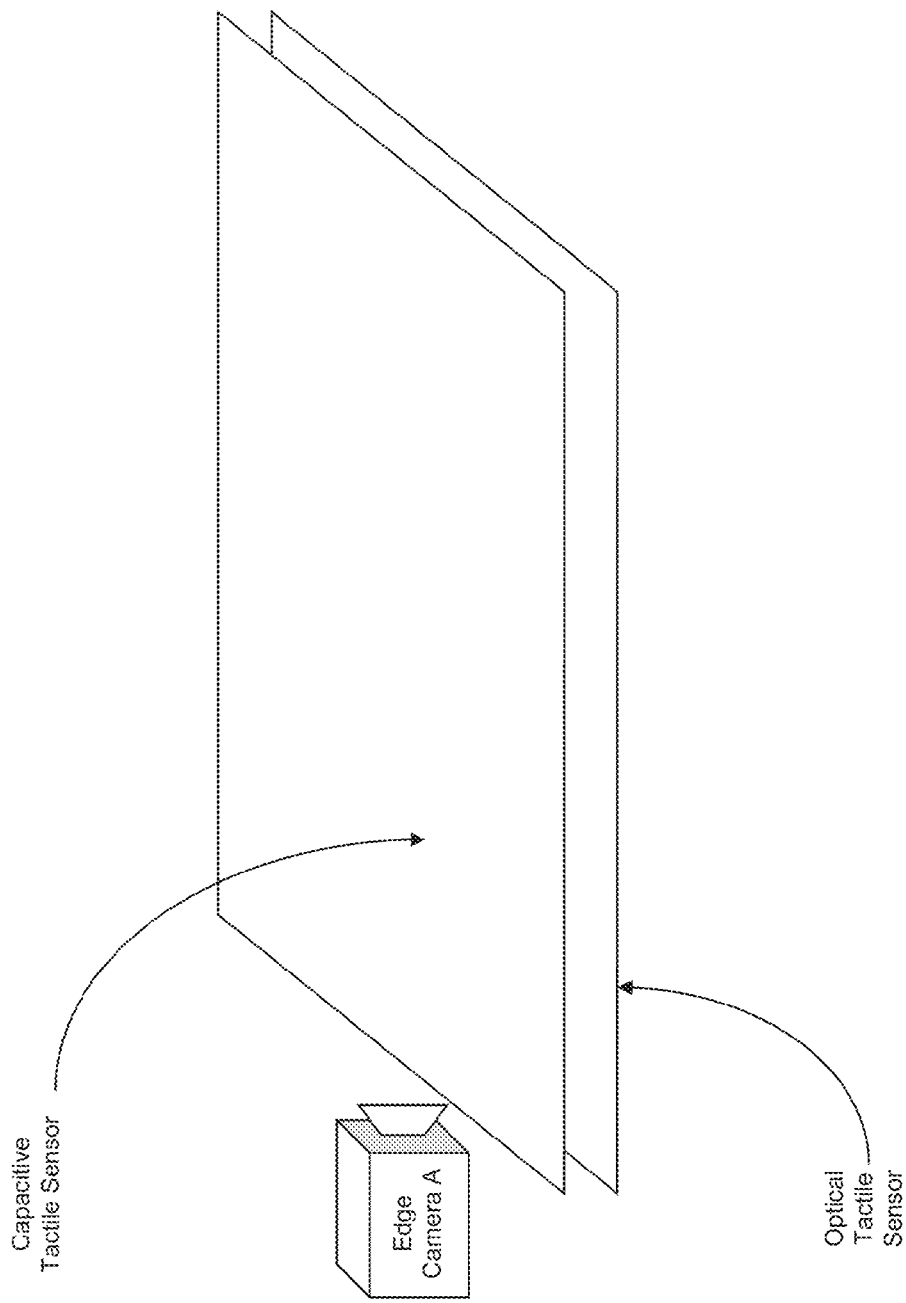
FIG. 22C depicts an example touch-based user interface arrangement comprising a video camera situated together with an arrangement such as those described in conjunction with FIG. 21A.
Figure 22D:
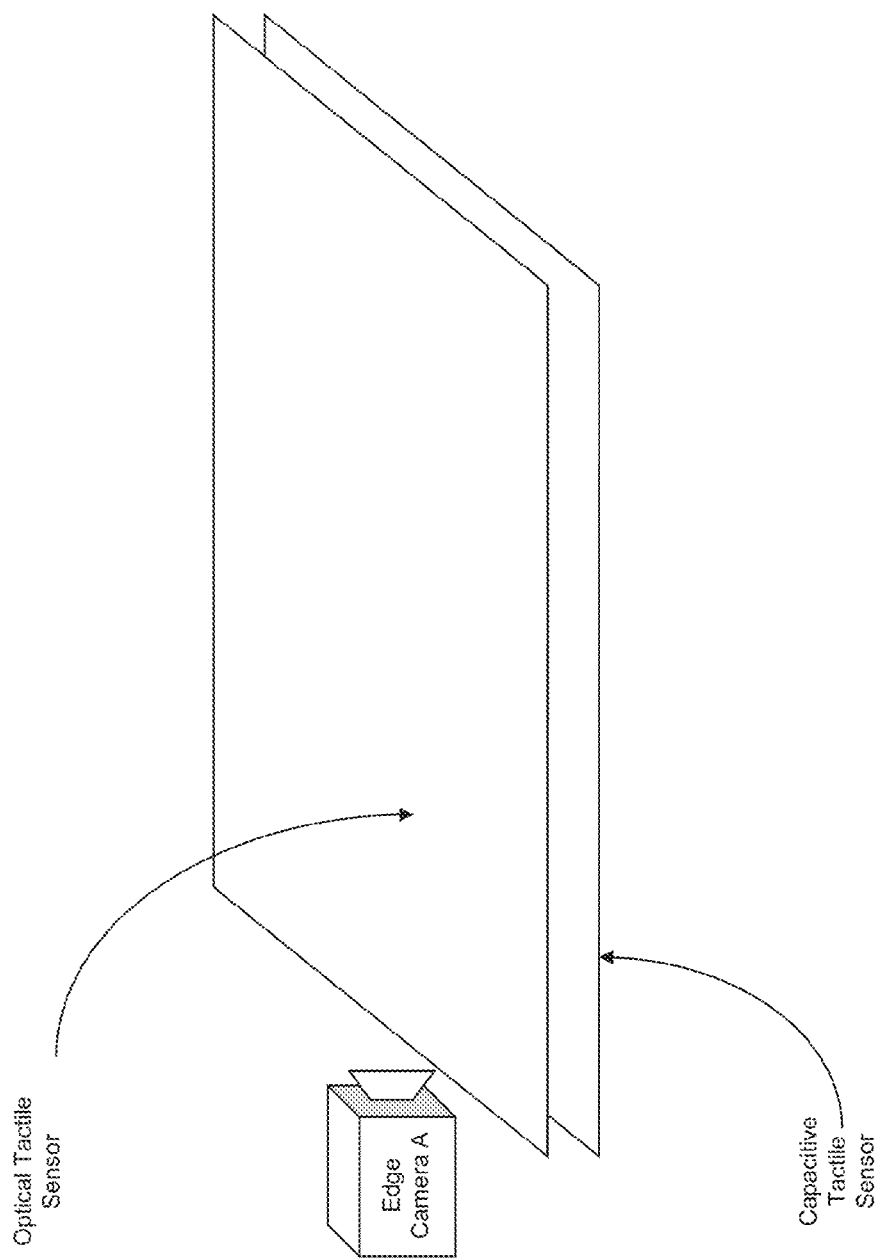
FIG. 22D depicts an example touch-based user interface arrangement comprising a video camera situated together with an arrangement such as those described in conjunction with FIG. 21B.

Regarding use of one camera, FIG. 22A depicts an example touch-based user interface arrangement comprising a single video camera situated together with a capacitive tactile sensor. Similarly, FIG. 22B depicts an example touch-based user interface arrangement comprising a video camera situated together with an optical tactile sensor. FIG. 22C depicts an example touch-based user interface arrangement comprising a video camera situated together with an arrangement such as those described in conjunction with FIG. 21B. FIG. 22D depicts an example touch-based user interface arrangement comprising a video camera situated together with an arrangement such as those described in conjunction with FIG. 21C.

Embodiment: Secondary Information Sensing Arrangement 2140 Includes 2 Cameras

Some embodiments of the present invention additionally provide for the combination of at least one tactile sensor (as tactile sensing arrangement 2110) and at least two video cameras (as secondary information sensing arrangement 2140) to be used as touch-based user interface arrangement. As taught in section 2.1.7.2 of both U.S. Pat. No. 6,570,078 and pending U.S. patent application Ser. No. 10/683,915, two or more video cameras can be arranged in orthogonal arrangements to capture hand expressions within 3-space regions. FIG. 23E depicts an example touch-based user interface arrangement comprising two video cameras configured in an orthogonal orientation so as to produce orthogonal views of a finger in a touch sensing region. As explained later, there are various structural approaches to processing the two video camera signals to provide user interface output signals. In one structural approach, each of the video camera signals are separately processed and the results of each are then combined and/or selectively chosen to produce user interface output signals. In another structural approach, both of the video camera signals are processed together to produce user interface output signals.

Regarding conversion of video camera signals to produce measurements or signals useful in producing user interface output signals, a number of approaches can be used. As an example, a video camera oriented to view the profile of far end of a user's fingertip, rolling a user finger clockwise or counterclockwise creates a video camera image that, upon edge extraction or high-contrast imaging, creates an elliptical shape whose angle of clockwise/counterclockwise orientation of its minor axis with respect to a reference position corresponds in some manner (for example, opposite direction) to the roll angle of the finger. Similarly, a video camera oriented to view the side-profile of a user's finger creates a video camera image that, upon edge extraction or high-contrast imaging, creates an elliptical shape whose angle of clockwise/counterclockwise orientation of its major axis with respect to a reference position corresponds in some manner to the pitch angle of the finger. The angle of finger rotation can then be recovered by various methods, for example employing the slope of a least-squares line-fit as taught in U.S. patent application Ser. No. 12/418,605 or the high-performance closed-form calculation of oblong-shape rotation angles methods taught in U.S. Pat. No. 8,170,346. The invention provides for a wide range of other approaches to be used, for example use of artificial neural networks as taught by Ser. No. 13/038,365 in conjunction with FIGS. 37-38 therein, the methods taught in in section 2.1.7.2 of U.S. Pat. No. 6,570,078 (such as use of pattern recognition, image interpretation, partitioning the video image into "sub-image cells," etc.), and/or other approaches. Additional considerations and approaches can be used to measure and/or compensate for the effect of the yaw angle of the user finger.

Figure 23A:
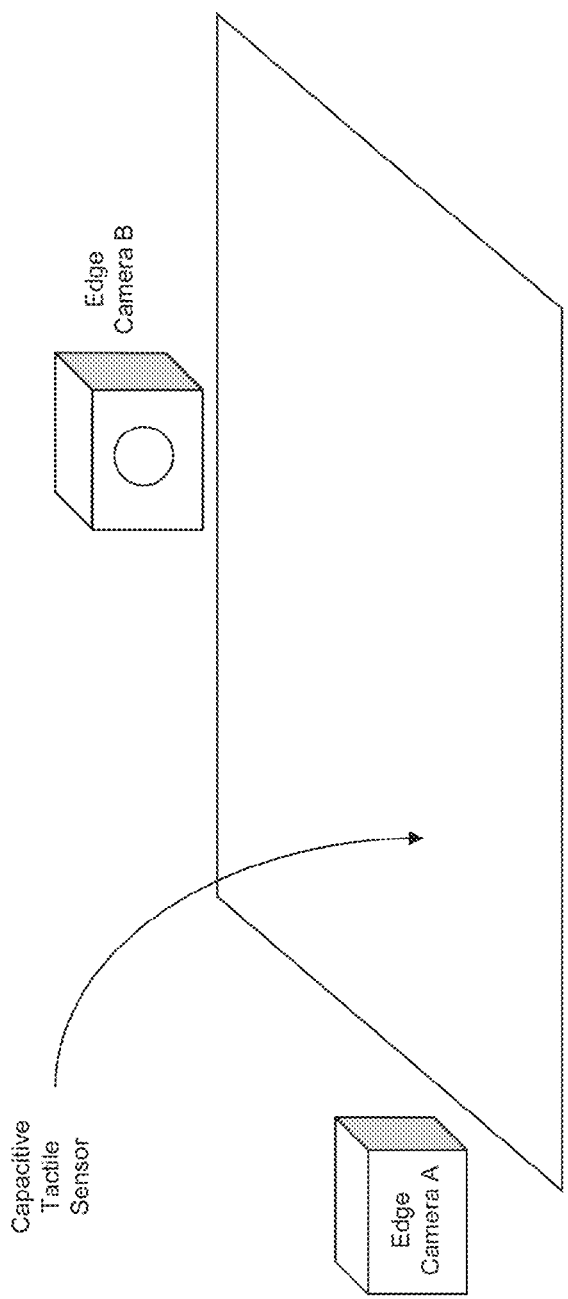
FIG. 23A depicts an example touch-based user interface arrangement comprising two video cameras configured as depicted in FIG. 21C (in an orthogonal orientation so as to produce orthogonal views of a finger in a touch sensing region) situated together with a capacitive tactile sensor.
Figure 23B:
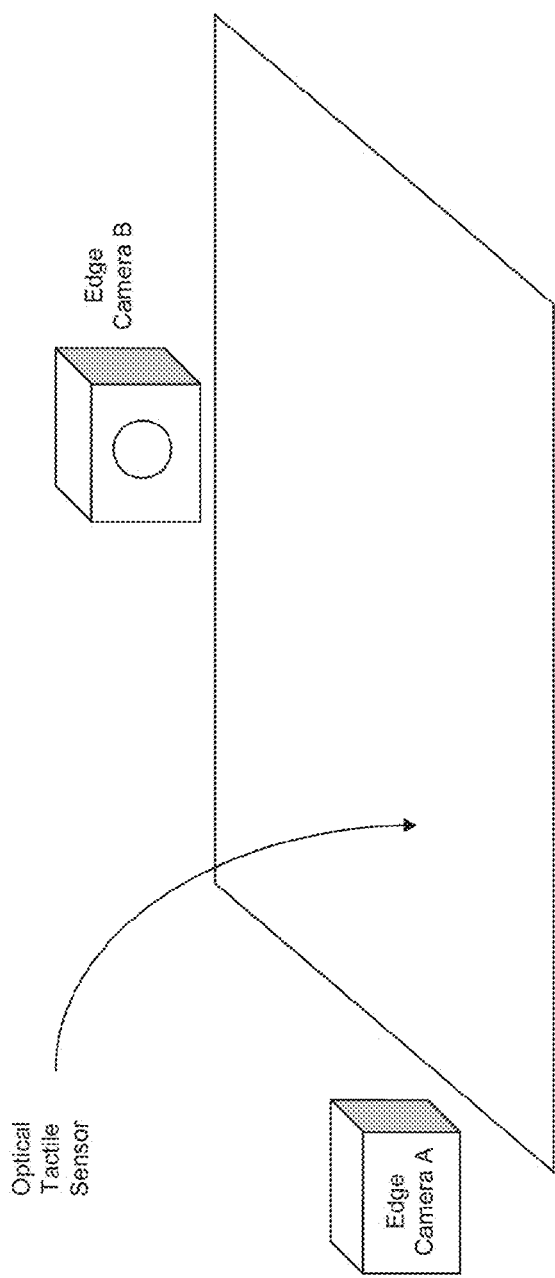
FIG. 23B depicts an example touch-based user interface arrangement comprising two video cameras configured as depicted in FIG. 21C situated together with an optical tactile sensor.
Figure 23C:
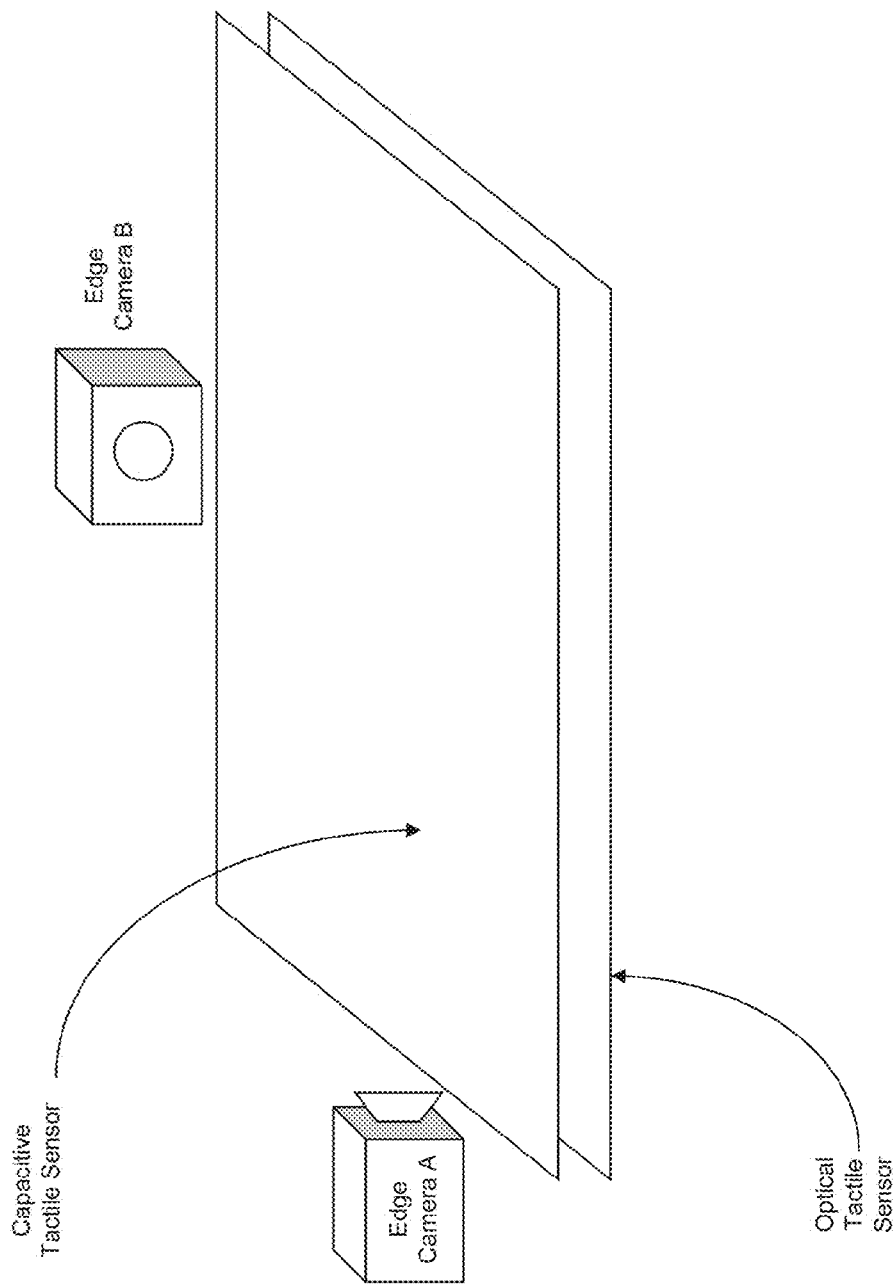
FIG. 23C depicts an example touch-based user interface arrangement comprising two video cameras configured as depicted in FIG. 21C situated together with an arrangement such as those described in conjunction with FIG. 21A.
Figure 23D:
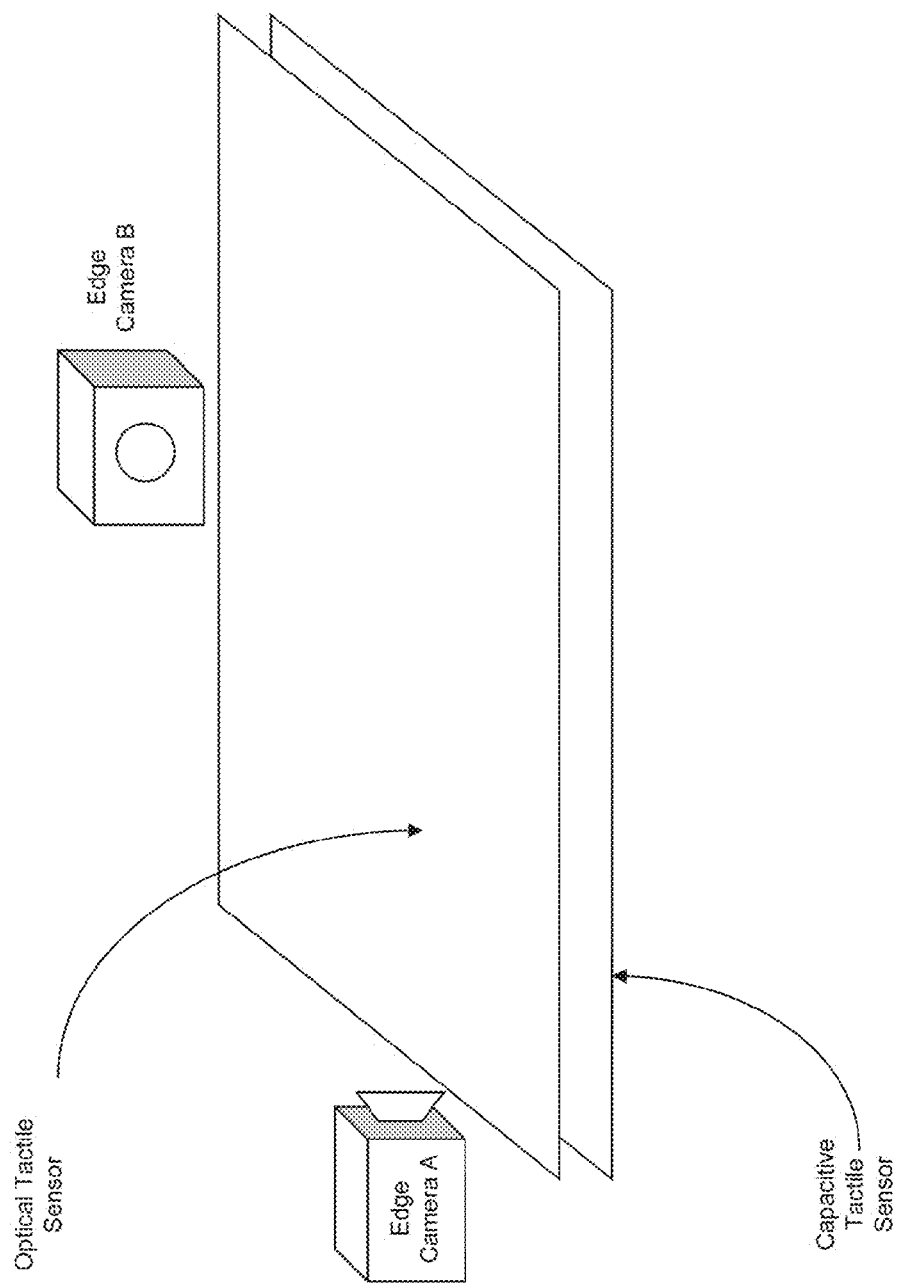
FIG. 23D depicts an example touch-based user interface arrangement comprising two video cameras configured as depicted in FIG. 21C situated together with an arrangement such as those described in conjunction with FIG. 21B.
Figure 23E:
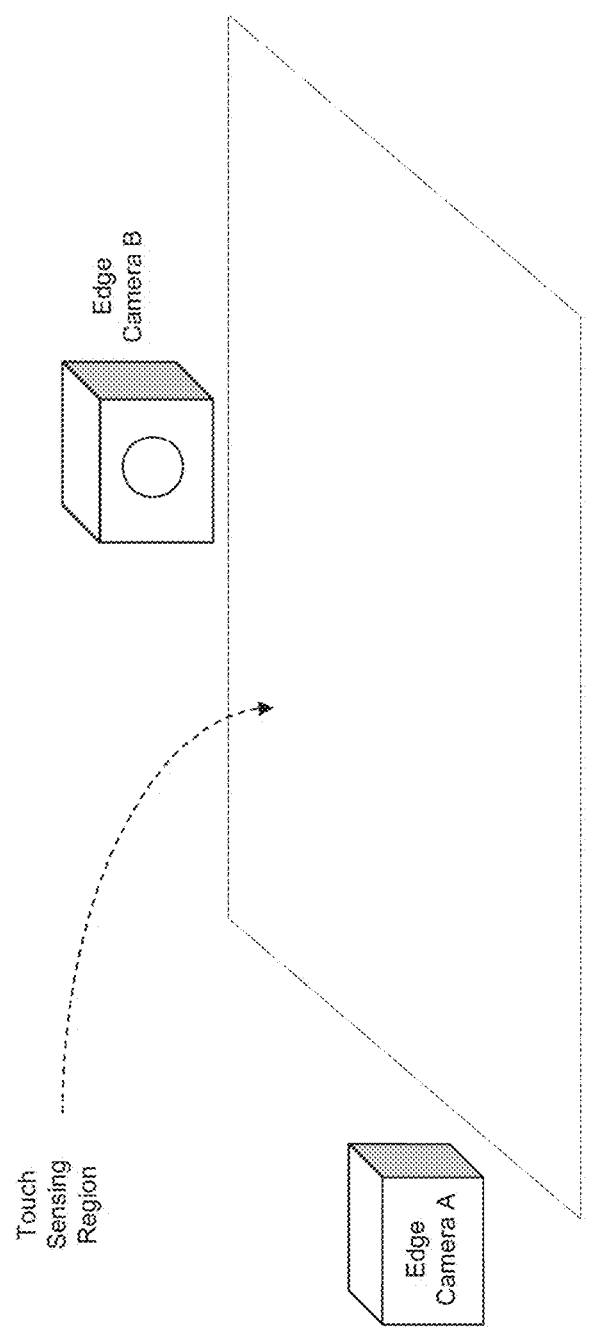
FIG. 23E depicts an example touch-based user interface arrangement comprising two video cameras configured in orthogonal orientations so as to produce orthogonal views of a finger in a touch sensing regions.

Regarding use of two cameras, FIG. 23A depicts an example touch-based user interface arrangement comprising two video cameras configured as depicted in FIG. 23E (in an orthogonal orientation so as to produce orthogonal views of a finger in a touch sensing region) situated together with a capacitive tactile sensor. Similarly, FIG. 23B depicts an example touch-based user interface arrangement comprising two video cameras configured as depicted in FIG. 23E situated together with an optical tactile sensor. FIG. 23C depicts an example touch-based user interface arrangement comprising two video cameras configured as depicted in FIG. 23E situated together with an arrangement such as those described in conjunction with FIG. 21B. FIG. 23D depicts an example touch-based user interface arrangement comprising two video cameras configured as depicted in FIG. 23E situated together with an arrangement such as those described in conjunction with FIG. 21C.

Figure 24A:
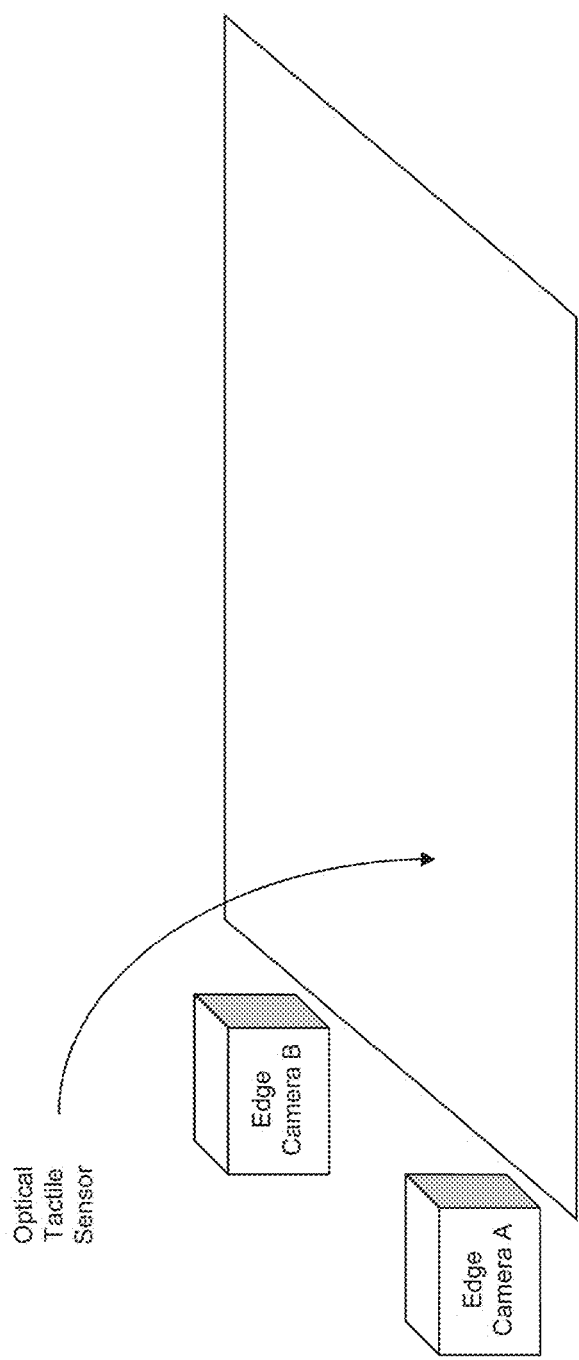
FIG. 24A depicts an example touch-based user interface arrangement comprising two video cameras configured to capture stereoscopic views of a finger in a touch sensing region, the two cameras situated together with a capacitive tactile sensor.
Figure 24B:
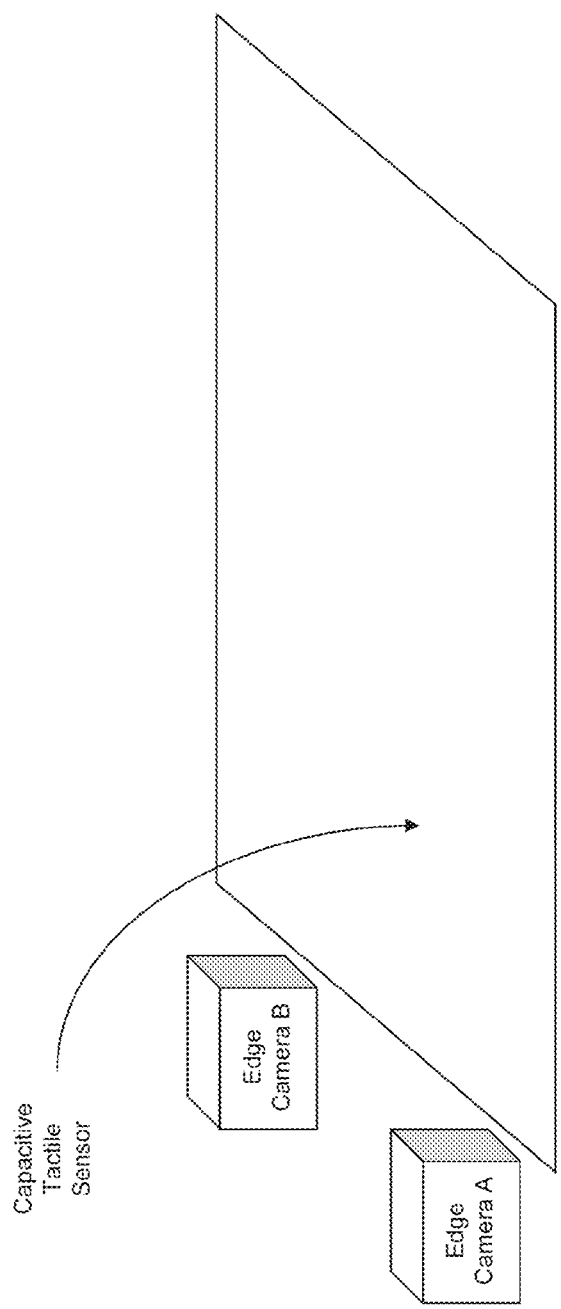
FIG. 24B depicts an example touch-based user interface arrangement comprising two video cameras configured to capture stereoscopic views of a finger in a touch sensing region, the two cameras situated together with an optical tactile sensor.
Figure 24C:
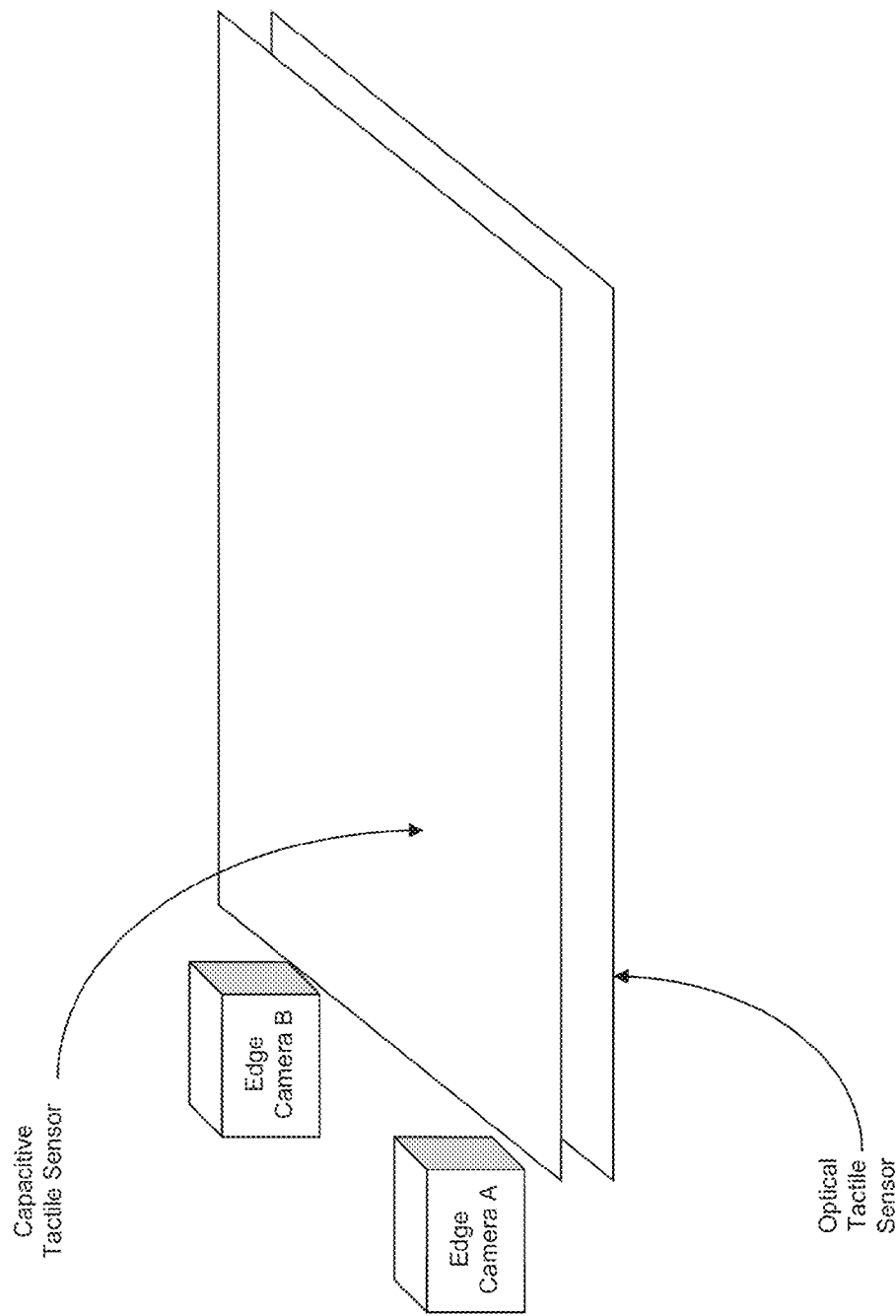
FIG. 24C depicts an example touch-based user interface arrangement comprising two video cameras configured to capture stereoscopic views of a finger in a touch sensing region, the two cameras situated together with an arrangement such as those described in conjunction with FIG. 21A.
Figure 24D:
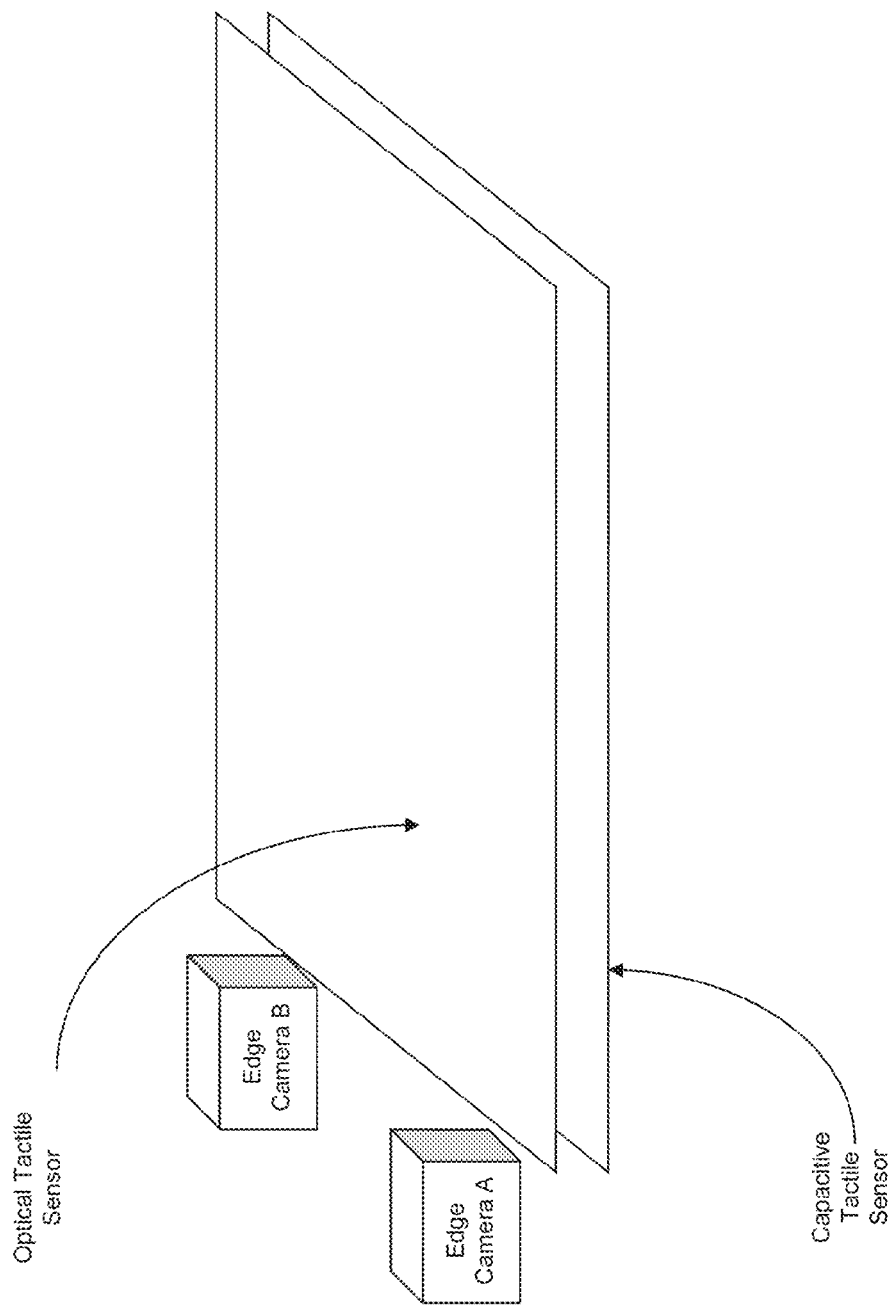
FIG. 24D depicts an example touch-based user interface arrangement comprising two video cameras configured to capture stereoscopic views of a finger in a touch sensing region, the two cameras situated together with an arrangement such as those described in conjunction with FIG. 21B.

Further as to the use of two cameras, as taught in section 2.1.7.2 of both U.S. Pat. No. 6,570,078 and pending U.S. patent application Ser. No. 10/683,915, two or more video cameras can be arranged in at least a stereoscopic arrangement to capture hand expressions within 3-space regions. As an example, FIG. 24A depicts an example touch-based user interface arrangement comprising two video cameras configured to capture stereoscopic views of a finger in a touch sensing region, the two cameras situated together with a capacitive tactile sensor. Similarly, FIG. 24B depicts an example touch-based user interface arrangement comprising two video cameras configured to capture stereoscopic views of a finger in a touch sensing region, the two cameras situated together with an optical tactile sensor. FIG. 24C depicts an example touch-based user interface arrangement comprising two video cameras configured to capture stereoscopic views of a finger in a touch sensing region, the two cameras situated together with an arrangement such as those described in conjunction with FIG. 21A. FIG. 24D depicts an example touch-based user interface arrangement comprising two video cameras configured to capture stereoscopic views of a finger in a touch sensing region, the two cameras situated together with an arrangement such as those described in conjunction with FIG. 21B.

Figure 25A:
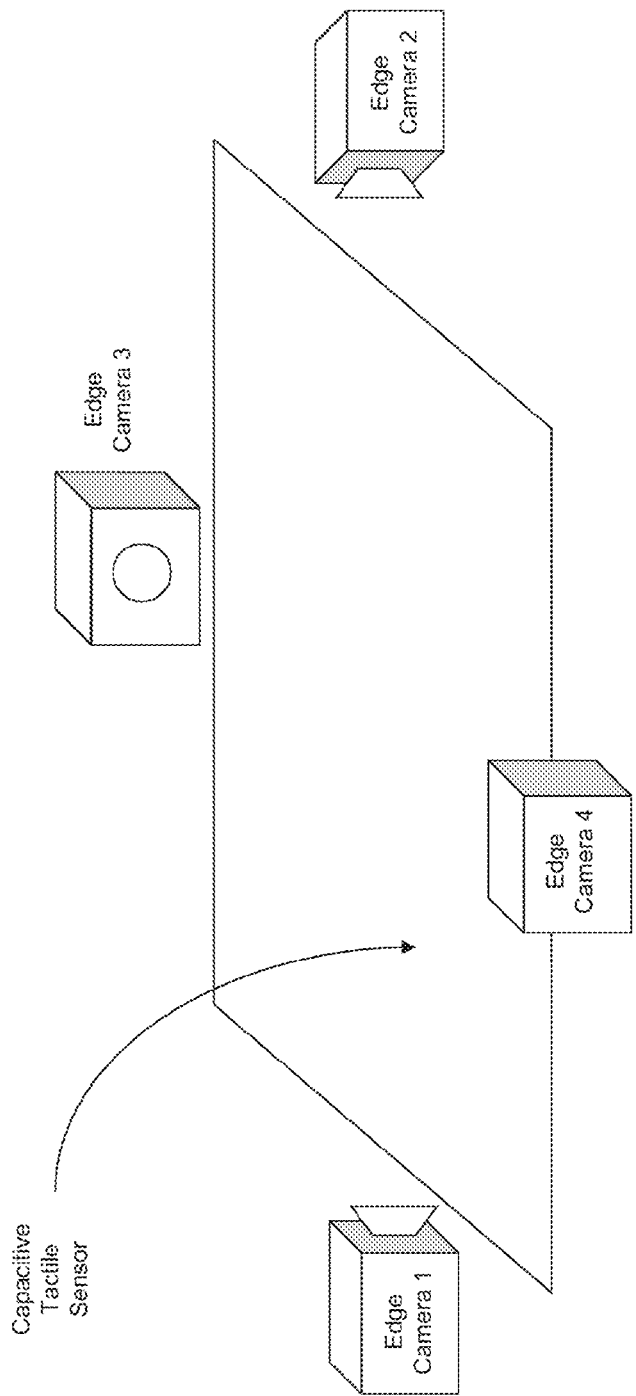
FIG. 25A depicts an example touch-based user interface arrangement comprising four video cameras configured in an orthogonal orientation so as to produce pairs of orthogonal views of a finger in a touch sensing region, the four cameras situated together with a capacitive tactile sensor.
Figure 25B:
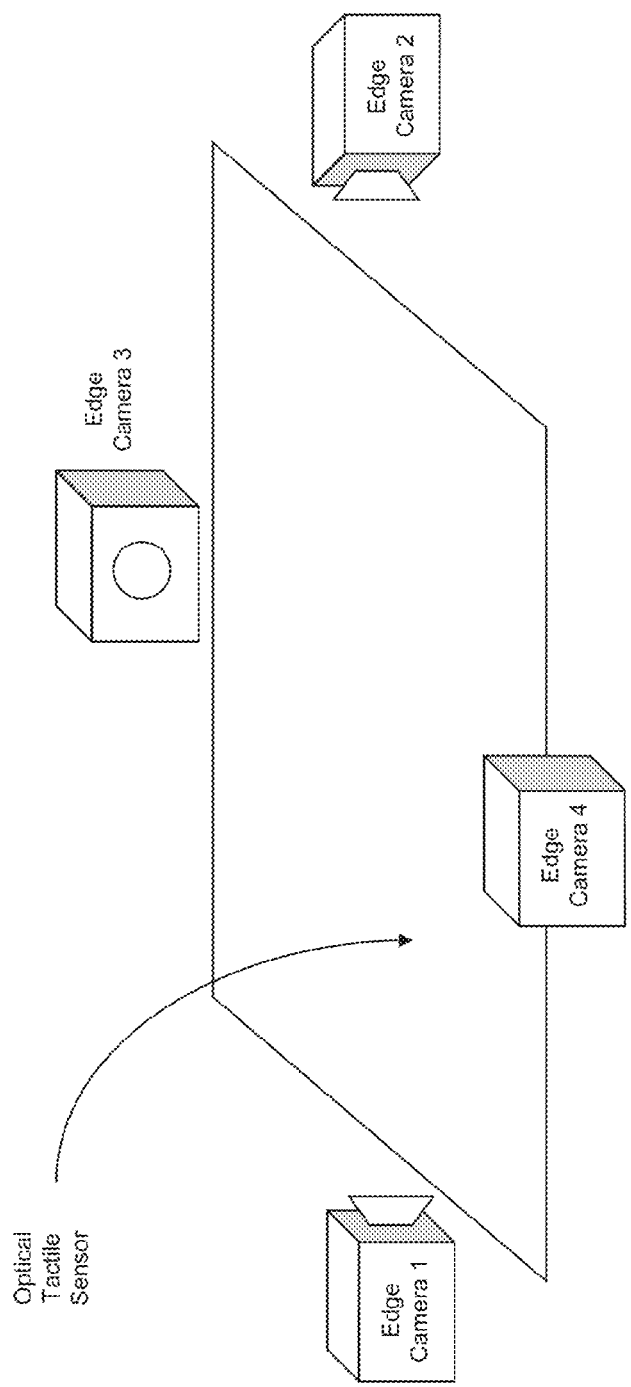
FIG. 25B depicts an example touch-based user interface arrangement comprising four video cameras configured in an orthogonal orientation so as to produce pairs of orthogonal views of a finger in a touch sensing region, the four cameras situated together with an optical tactile sensor.
Figure 25C:
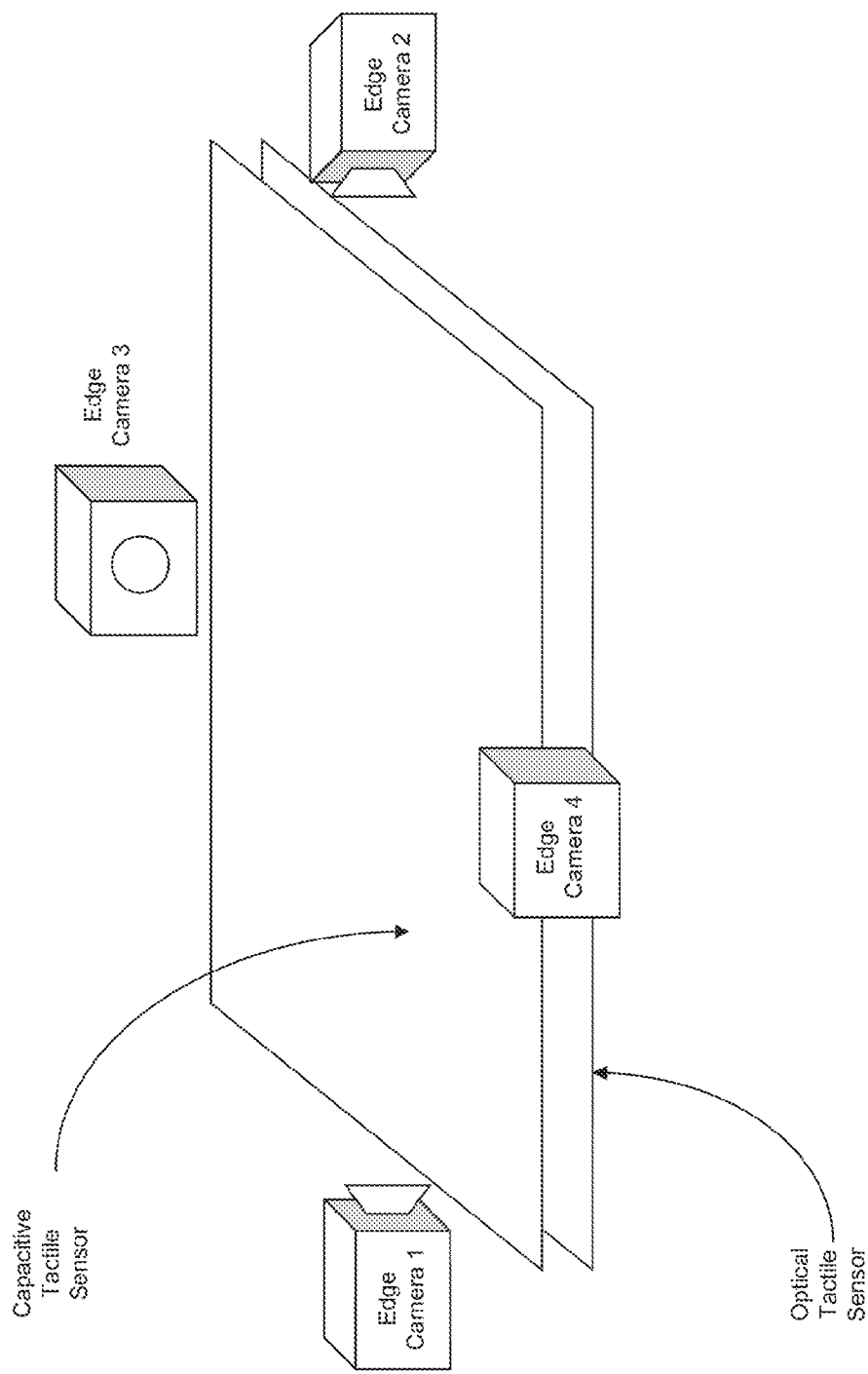
FIG. 25C depicts an example touch-based user interface arrangement comprising two video cameras configured in an orthogonal orientation so as to produce pairs of orthogonal views of a finger in a touch sensing region, the four cameras situated together with an arrangement such as those described in conjunction with FIG. 21A.
Figure 25D:
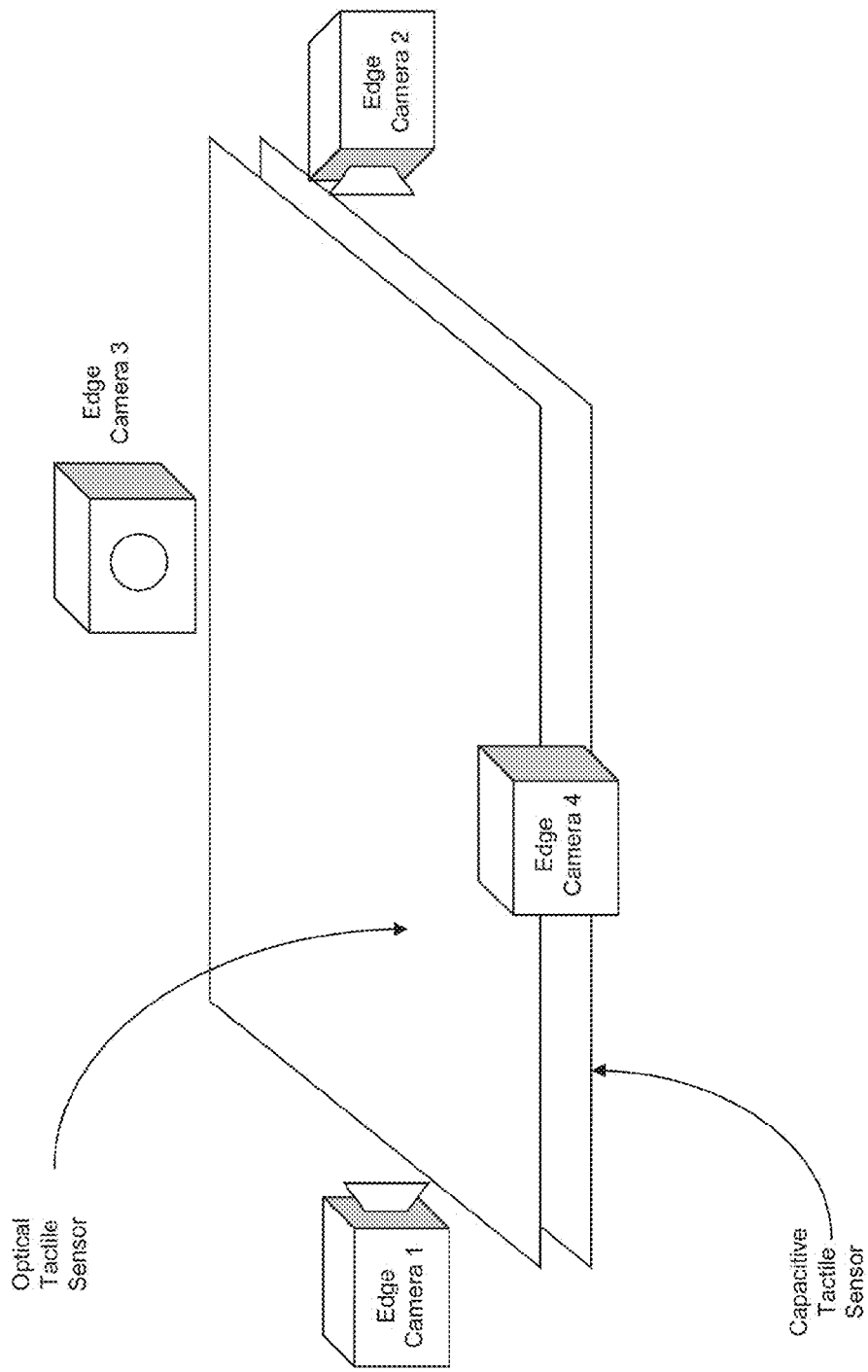
FIG. 25D depicts an example touch-based user interface arrangement comprising two video cameras configured in an orthogonal orientation so as to produce pairs of orthogonal views of a finger in a touch sensing region, the four cameras situated together with an arrangement such as those described in conjunction with FIG. 21B.

Embodiment: Secondary Information Sensing Arrangement 2140 Includes More than 2 Cameras Embodiments of the present invention also provide for more than two cameras (for example, 4, 8, etc.) to be used in various configurations. As a representative but by no means limiting example, FIG. 25A depicts an example touch-based user interface arrangement comprising four video cameras configured in an orthogonal orientation so as to produce pairs of orthogonal views of a finger in a touch sensing region, the four cameras situated together with a capacitive tactile sensor. Similarly, FIG. 25B depicts an example touch-based user interface arrangement comprising four video cameras configured in an orthogonal orientation so as to produce pairs of orthogonal views of a finger in a touch sensing region, the four cameras situated together with an optical tactile sensor. FIG. 25C depicts an example touch-based user interface arrangement comprising two video cameras configured in an orthogonal orientation so as to produce pairs of orthogonal views of a finger in a touch sensing region, the four cameras situated together with an arrangement such as those described in conjunction with FIG. 21A. FIG. 25D depicts an example touch-based user interface arrangement comprising two video cameras configured in an orthogonal orientation so as to produce pairs of orthogonal views of a finger in a touch sensing region, the four cameras situated together with an arrangement such as those described in conjunction with FIG. 21C.

Alternatively, a pressure sensor array can additionally be added to any of the arrangements depicted in FIGS. 21B-25.

Alternatively, a pressure sensor array can be substituted for the optical tactile sensor in any of the arrangements depicted in FIGS. 21B-25.

Alternatively, a pressure sensor array can be substituted for the capacitive tactile sensor in any of the arrangements depicted in FIGS. 21B-25.

In each of the arrangements discussed above wherein the sensor arrangement is compatible with a touchscreen implementation, the resultant output signals can be used to implement touchscreen functions, which in turn can be used to control applications.

In various embodiments, each of the arrangements discussed above wherein the sensor arrangement is compatible with an HDTP implementation, the resultant output signals can be used to implement HDTP functions, which in turn can be used to control applications.

In various embodiments, each of the arrangements discussed above wherein the sensor arrangement is compatible with both a touchscreen implementation and an HDTP implementation, the resultant output signals can be used to implement HDTP touchscreen functions, which in turn can be used to control applications.

In various embodiments, each of the arrangements discussed above involving at least one video camera, the resultant output signals can be used to implement functions beyond those of HDTP functions, which in turn can be used to control applications.

Example Interfacing and Processing Arrangements for Multiple Sensor Configurations This section provides a number of examples of interfacing and processing arrangements for multiple sensor configurations, for example those discussed above in conjunction with FIGS. 21-25. The tactile sensing arrangement 2110 produce measured contact information while the secondary information sensing arrangement 2140 (such as, one or more video cameras located on the edges of a touch sensing region) produce observed contact information. The associated handling and processing of the measured sense information 2115 produced by one or more tactile sensors and the secondary information 2145 (e.g., observed contact information produced by one or more video cameras located on the edges of a touch sensing region) is considered in the section following the present section.

As explained later, there are at least two general types of structural approaches to the handling and processing the sensor measurements 2115 and/or secondary information 2145 to provide user interface output signals. In a first structural approach, each of the sensor measurements 2115 and the secondary information 2145 is separately processed and the results of each are then combined and/or selectively chosen to produce improved performance. In a second structural approach, both of the sensor measurements 2115 and the secondary information 2145 are processed together to produce improved performance.

Figures 26, 27:
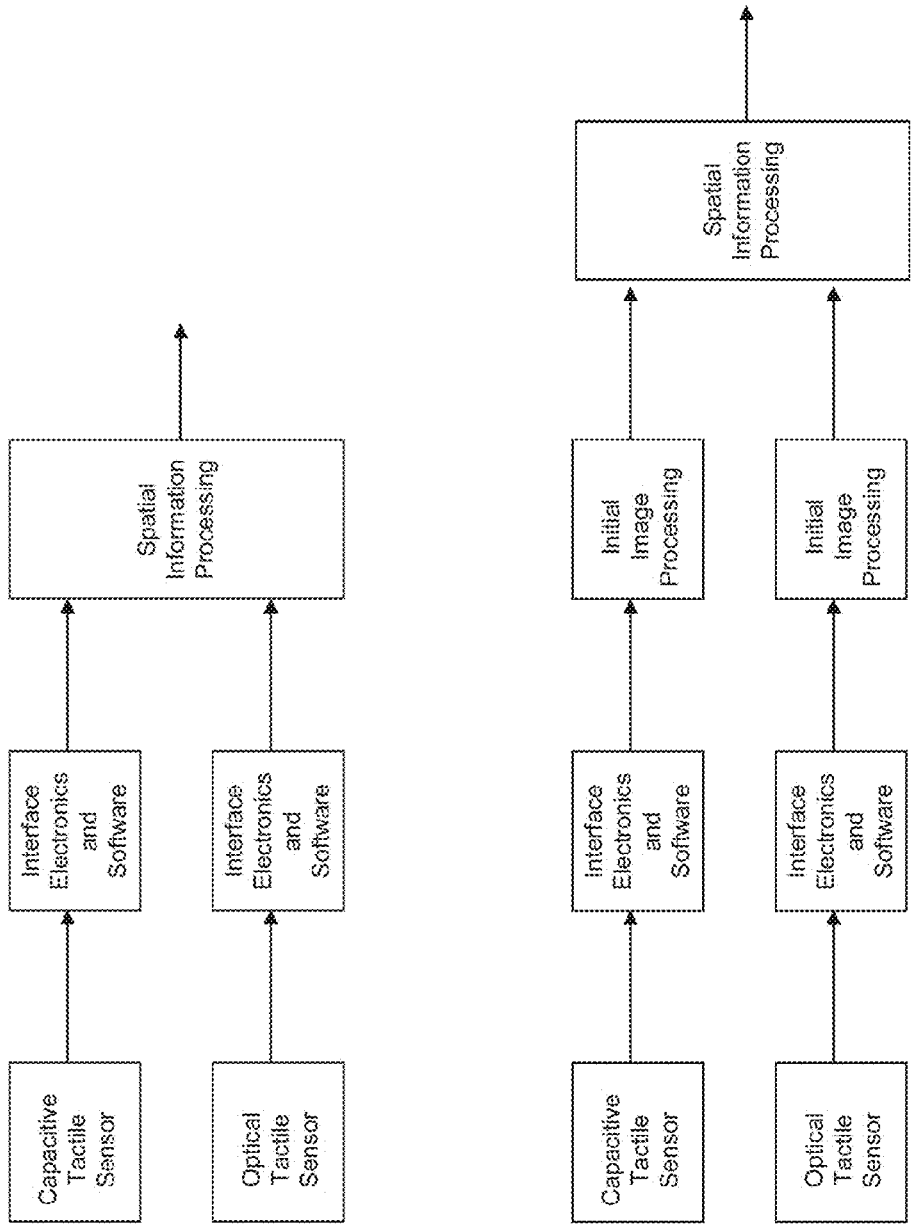
FIG. 26 illustrates an exemplary arrangement wherein a capacitive tactile sensor and an optical tactile sensor are used together to measure contact, for example, with part of a human hand, and after interfacing and software operations, subsequently provide information to a spatial information processing stage which produces output signals responsive to the measured contact.
FIG. 27 illustrates an exemplary arrangement wherein a capacitive tactile sensor and an optical tactile sensor are used together to measure contact, for example, with part of a human hand, and after interfacing software and initial image processing operations, subsequently provide information to a spatial information processing stage which produces output signals responsive to the measured contact.

FIG. 26 illustrates an example interfacing and processing arrangement wherein a capacitive tactile sensor and an optical tactile sensor are used together to measure contact, for example, with part of a human hand, and after interfacing and software operations, subsequently provide information to a spatial information processing stage which produces output signals responsive to the measured contact. Such an interfacing and processing arrangement can be used, for example, with the configurations depicted in FIGS. 21B-21C. Note this interfacing and processing arrangement is naturally associated with the aforedefined second structural approach.

FIG. 27 illustrates an example interfacing and processing arrangement wherein a capacitive tactile sensor and an optical tactile sensor are used together to measure contact, for example, with part of a human hand, and after interfacing software and initial image processing operations, subsequently provide information to a spatial information processing stage which produces output signals responsive to the measured contact. Such an interfacing and processing arrangement can be used, for example, with the configurations depicted in FIGS. 21A-21B. Note this interfacing and processing arrangement is naturally associated with the aforedefined first structural approach.

Figure 28:
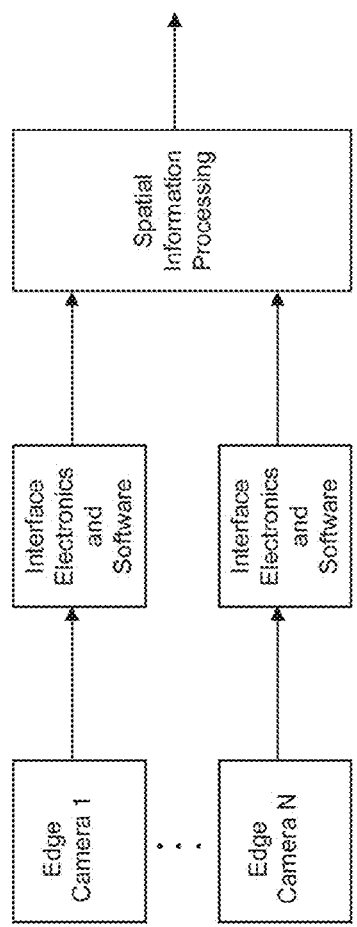
FIG. 28 illustrates an exemplary arrangement wherein a plurality of edge cameras are used together to observe contact, for example, with part of a human hand, and after interfacing and software operations, subsequently provide information to a spatial information processing stage which produces output signals responsive to the observed contact.

FIG. 28 illustrates an example interfacing and processing arrangement wherein a plurality of edge cameras are used together to observe contact, for example, with part of a human hand, and after interfacing and software operations, subsequently provide information to a spatial information processing stage which produces output signals responsive to the observed contact. Such an interfacing and processing arrangement can be used, for example, with the configurations depicted in FIG. 23E. Note this interfacing and processing arrangement is naturally associated with the aforedefined second structural approach.

Figure 29:
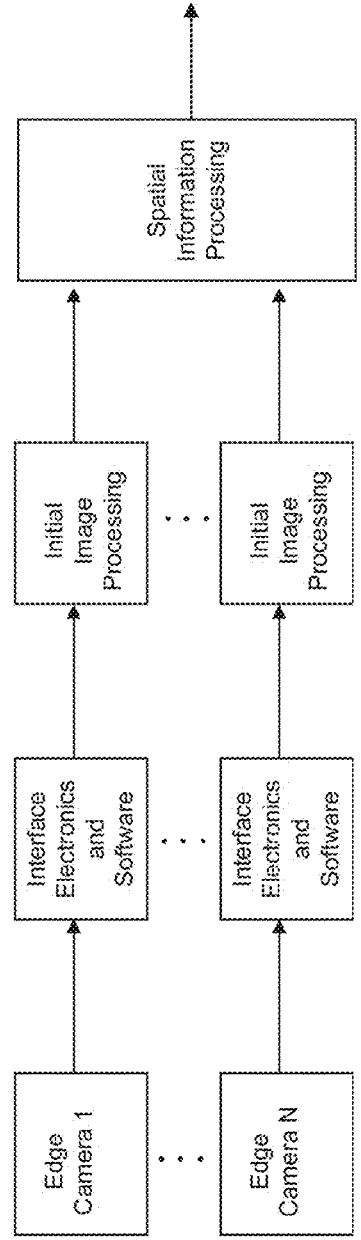
FIG. 29 illustrates an exemplary arrangement wherein a plurality of edge cameras are used together to observe contact, for example, with part of a human hand, and after interfacing software and initial image processing operations, subsequently provide information to a spatial information processing stage which produces output signals responsive to the observed contact.

FIG. 29 illustrates an example interfacing and processing arrangement wherein a plurality of edge cameras are used together to observe contact, for example, with part of a human hand, and after interfacing software and initial image processing operations, subsequently provide information to a spatial information processing stage which produces output signals responsive to the observed contact. Such an interfacing and processing arrangement can be used, for example, with the configurations depicted in FIG. 23E. Note this interfacing and processing arrangement is naturally associated with the aforedefined first structural approach.

Figure 30:
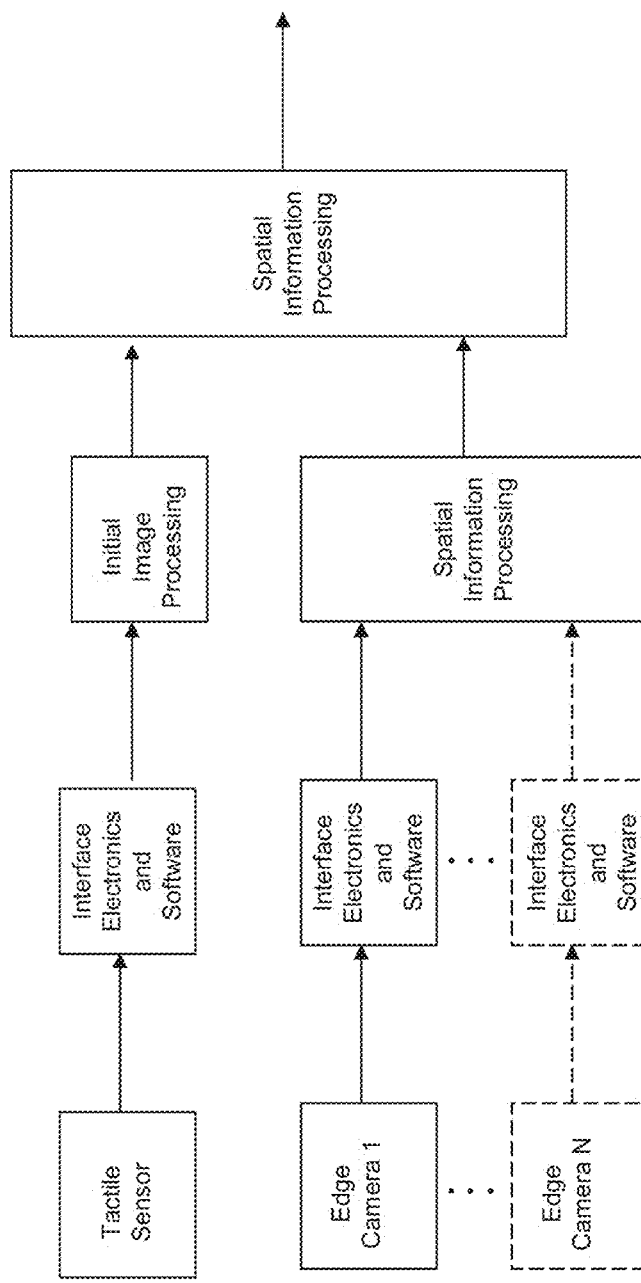
FIG. 30 illustrates an exemplary arrangement wherein a plurality of edge cameras are used together to observe contact, for example, with part of a human hand, and after interfacing and software operations, subsequently provide information to a spatial information processing stage which produces first output signals responsive to the observed contact, and this first output signal is subsidized with second output signals provided by initial image processing of signals obtained from a tactile sensor configured to measure contact with, for example, part of that human hand, and wherein the first output signals and second output signals are further processed to produce final output signals responsive to the observed and measured contact.

FIG. 30 illustrates an example interfacing and processing arrangement wherein a plurality of edge cameras are used together to observe contact, for example, with part of a human hand, and after interfacing and software operations, subsequently provide information to a spatial information processing stage which produces first output signals responsive to the observed contact, and this first output signal is subsidized with second output signals provided by initial image processing of signals obtained from a tactile sensor configured to measure contact with, for example, part of that human hand, and wherein the first output signals and second output signals are further processed to produce final output signals responsive to the observed and measured contact. Such an interfacing and processing arrangement can be used, for example, with the configurations depicted in FIGS. 22A-22B, 23A-23B, 24A-24B, and 25A-25B. Note this interfacing and processing arrangement employs a mixture of the first and second structural approach.

Figure 31:
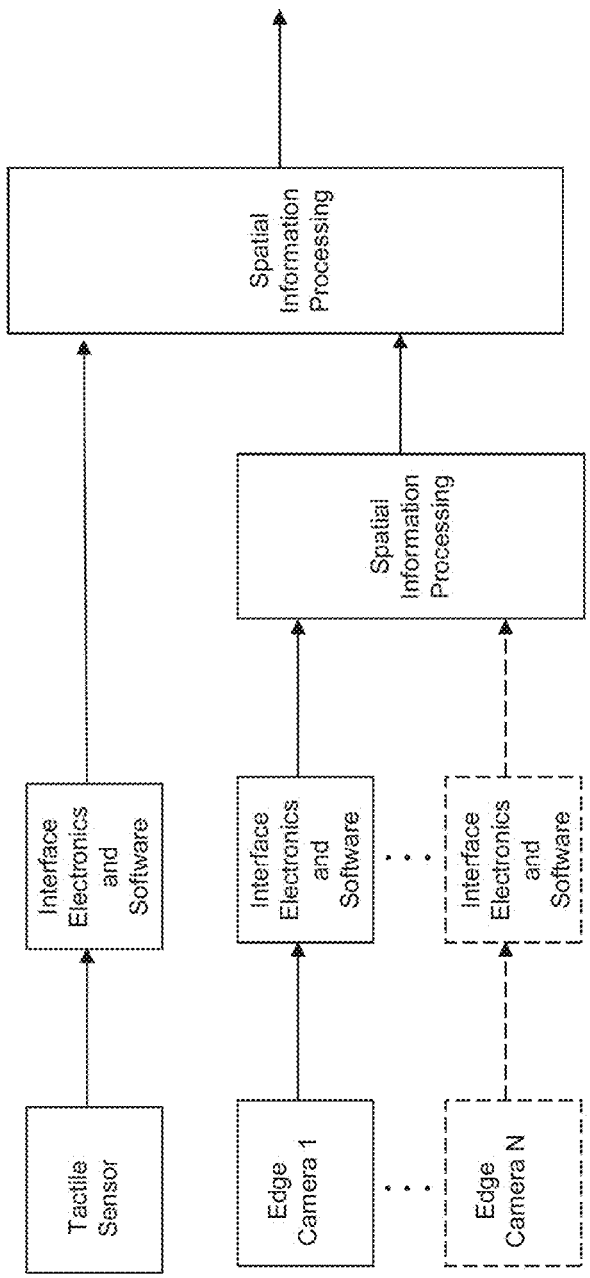
FIG. 31 illustrates an exemplary variation on the arrangement of FIG. 29 wherein the second output is not subjected to initial image processing.

FIG. 31 illustrates an example variation on the arrangement of FIG. 30 wherein the second output is not subjected to initial image processing. Such an interfacing and processing arrangement can be used, for example, with the configurations depicted in FIGS. 22A-22B, 23A-23B, 24A-24B, and 25A-25B. Note this interfacing and processing arrangement employs a different mixture of the first and second structural approach.

Figure 32:
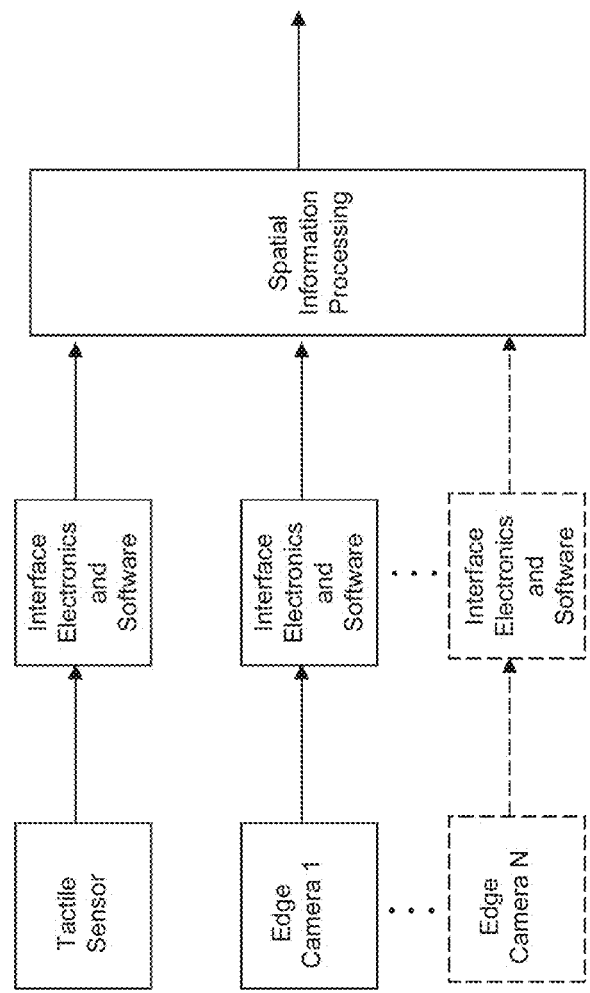
FIG. 32 illustrates an exemplary variation on the arrangement of FIG. 30 wherein the first output is not subjected to spatial information processing.

FIG. 32 illustrates an example variation on the arrangement of FIG. 31 wherein the first output is not subjected to spatial information processing. Such an interfacing and processing arrangement can be used, for example, with the configurations depicted in FIGS. 22A-22B, 23A-23B, 24A-24B, and 25A-25B. Note this interfacing and processing arrangement is naturally associated with the second structural approach.

Figure 33:
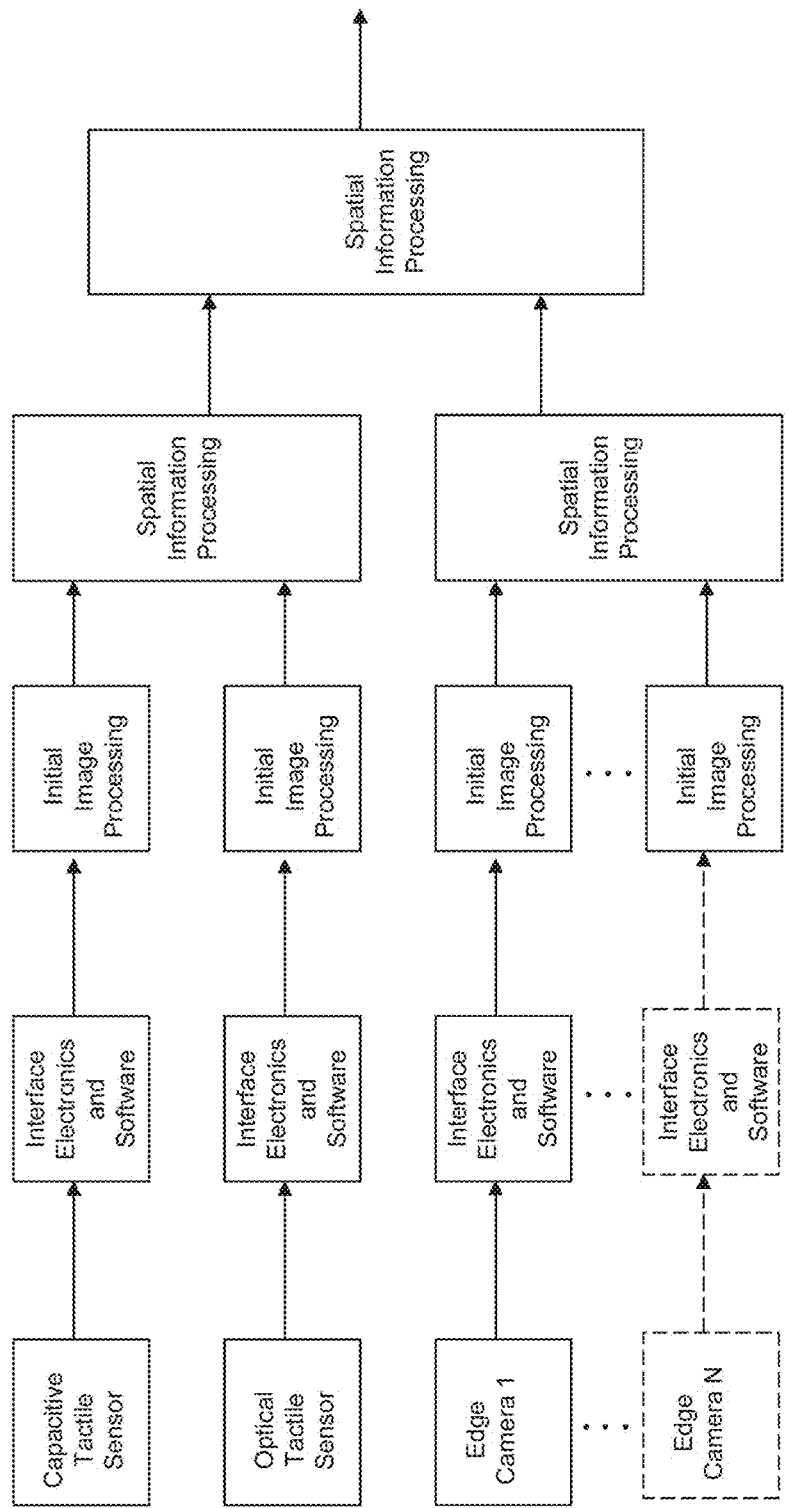
FIG. 33 illustrates an exemplary arrangement wherein an arrangement such as that depicted in FIG. 27 and an arrangement such as that depicted in FIG. 29 are combined, wherein the arrangement such as that depicted in FIG. 27 is configured to produce first output signals responsive to the measured contact, for example, with part of a human hand, and the arrangement such as that depicted in FIG. 29 is configured to produce second output signals responsive to the observed contact, and wherein the first output signals and second output signals are further processed to produce final output signals responsive to the observed and measured contact.

FIG. 33 illustrates an example arrangement wherein an arrangement such as that depicted in FIG. 27 and an arrangement such as that depicted in FIG. 29 are combined, wherein the arrangement such as that depicted in FIG. 27 is configured to produce first output signals responsive to the measured contact, for example, with part of a human hand, and the arrangement such as that depicted in FIG. 29 is configured to produce second output signals responsive to the observed contact, and wherein the first output signals and second output signals are further processed to produce final output signals responsive to the observed and measured contact. Such an interfacing and processing arrangement can be used, for example, with the configurations depicted in FIGS. 22C-22D, 23C-23D, 24C-24D, and 25C-25D. Note this interfacing and processing arrangement is naturally associated with the first structural approach throughout.

Figure 34:
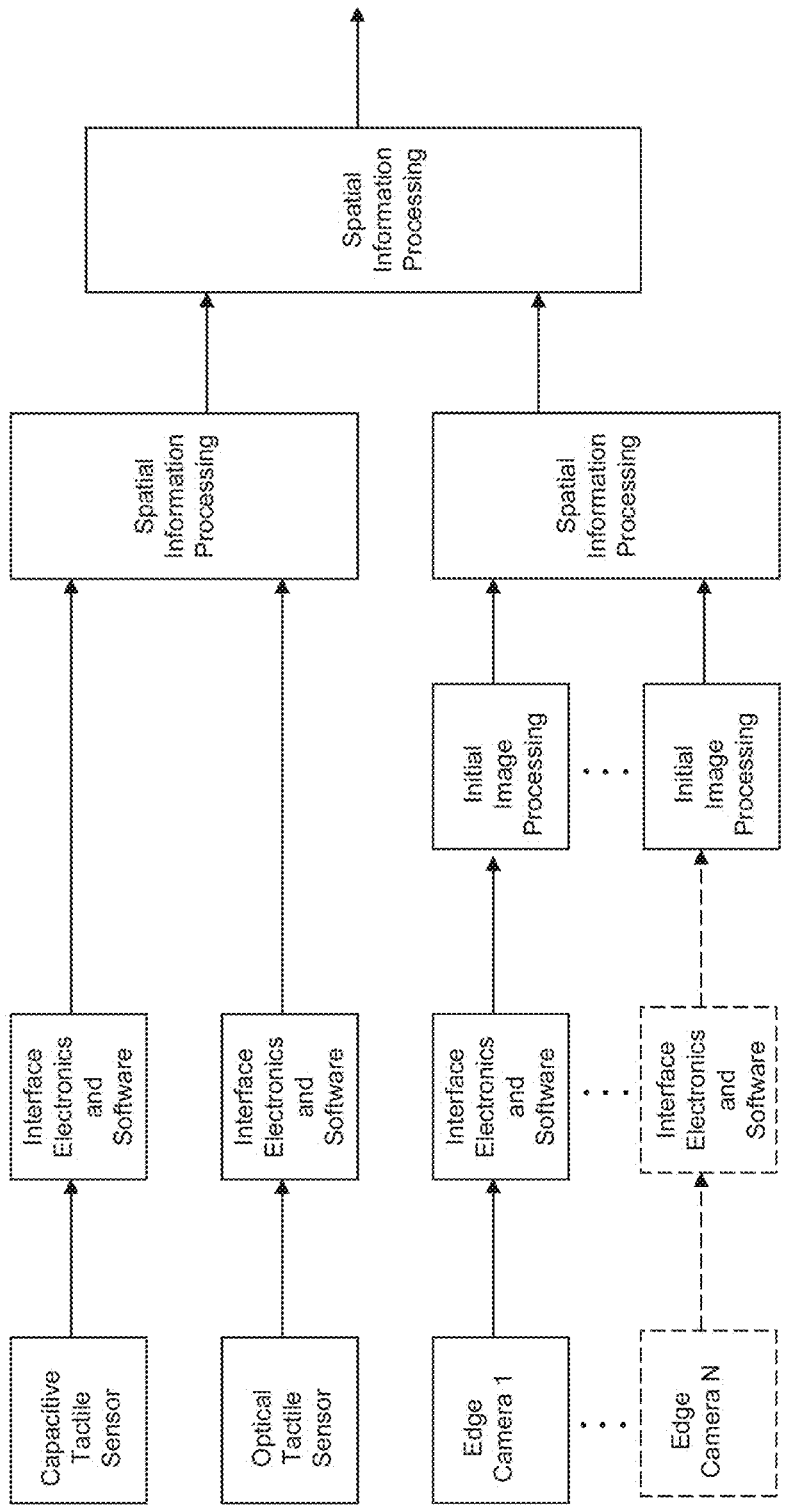
FIG. 34 illustrates an exemplary variation on the arrangement of FIG. 33 wherein an arrangement such as that depicted in FIG. 26 and an arrangement such as that depicted in FIG. 27 are combined, wherein the arrangement such as that depicted in FIG. 26 is configured to produce first output signals responsive to the measured contact, for example, with part of a human hand, and the arrangement such as that depicted in FIG. 29 is configured to produce second output signals responsive to the observed contact, and wherein the first output signals and second output signals are further processed to produce final output signals responsive to the observed and measured contact.

FIG. 34 illustrates an example variation on the arrangement of FIG. 33 wherein an arrangement such as that depicted in FIG. 26 and an arrangement such as that depicted in FIG. 27 are combined, wherein the arrangement such as that depicted in FIG. 26 is configured to produce first output signals responsive to the measured contact, for example, with part of a human hand, and the arrangement such as that depicted in FIG. 29 is configured to produce second output signals responsive to the observed contact, and wherein the first output signals and second output signals are further processed to produce final output signals responsive to the observed and measured contact. Such an interfacing and processing arrangement can be used, for example, with the configurations depicted in FIGS. 22C-22D, 23C-23D, 24C-24D, and 25C-25D. Note this interfacing and processing arrangement employs a mixture of the first and second structural approach.

Figure 35:
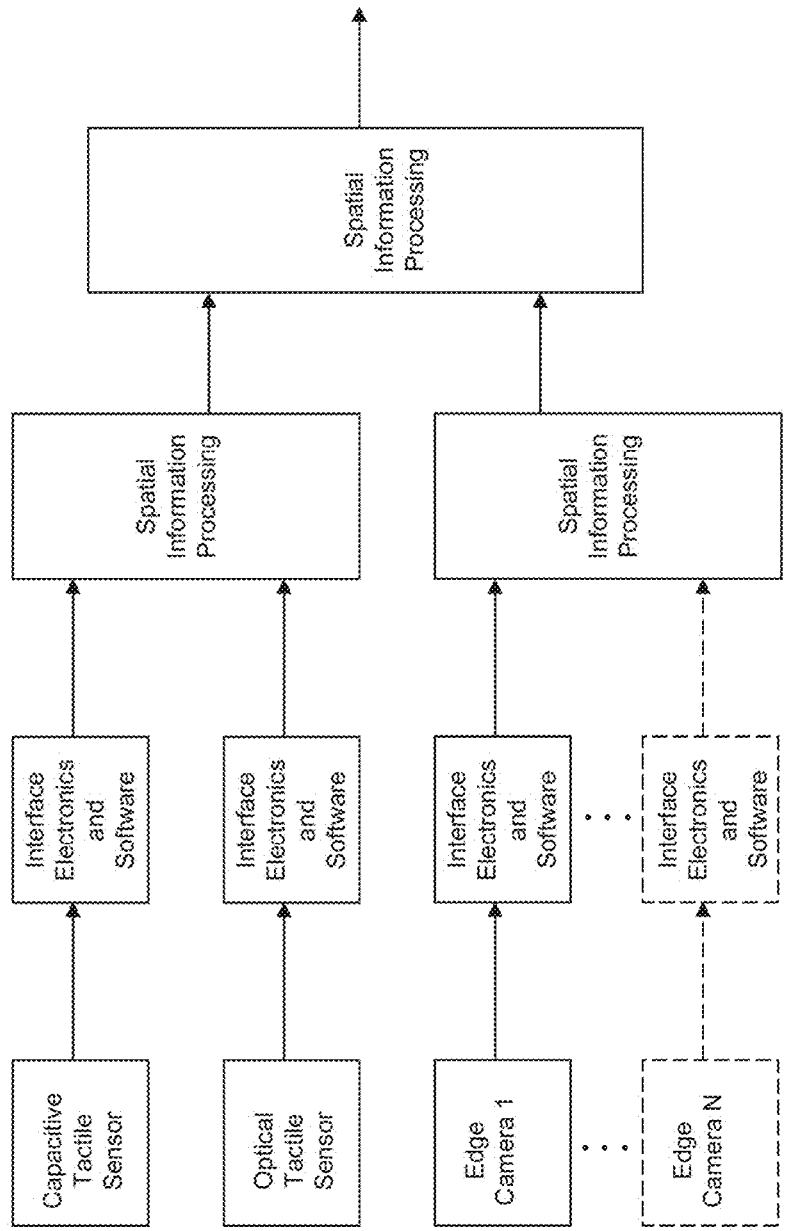
FIG. 35 illustrates an exemplary variation on the arrangement of FIG. 33 wherein an arrangement such as that depicted in FIG. 26 and an arrangement such as that depicted in FIG. 28 are combined, wherein the arrangement such as that depicted in FIG. 26 is configured to produce first output signals responsive to the measured contact, for example, with part of a human hand, and the arrangement such as that depicted in FIG. 28 is configured to produce second output signals responsive to the observed contact, and wherein the first output signals and second output signals are further processed to produce final output signals responsive to the observed and measured contact.

FIG. 35 illustrates an example variation on the arrangement of FIG. 33 wherein an arrangement such as that depicted in FIG. 26 and an arrangement such as that depicted in FIG. 28 are combined, wherein the arrangement such as that depicted in FIG. 26 is configured to produce first output signals responsive to the measured contact, for example, with part of a human hand, and the arrangement such as that depicted in FIG. 28 is configured to produce second output signals responsive to the observed contact, and wherein the first output signals and second output signals are further processed to produce final output signals responsive to the observed and measured contact. Such an interfacing and processing arrangement can be used, for example, with the configurations depicted in FIGS. 22C-22D, 23C-23D, 24C-24D, and 25C-25D. Note this interfacing and processing arrangement employs a different mixture of the first and second structural approach.

Figure 36:
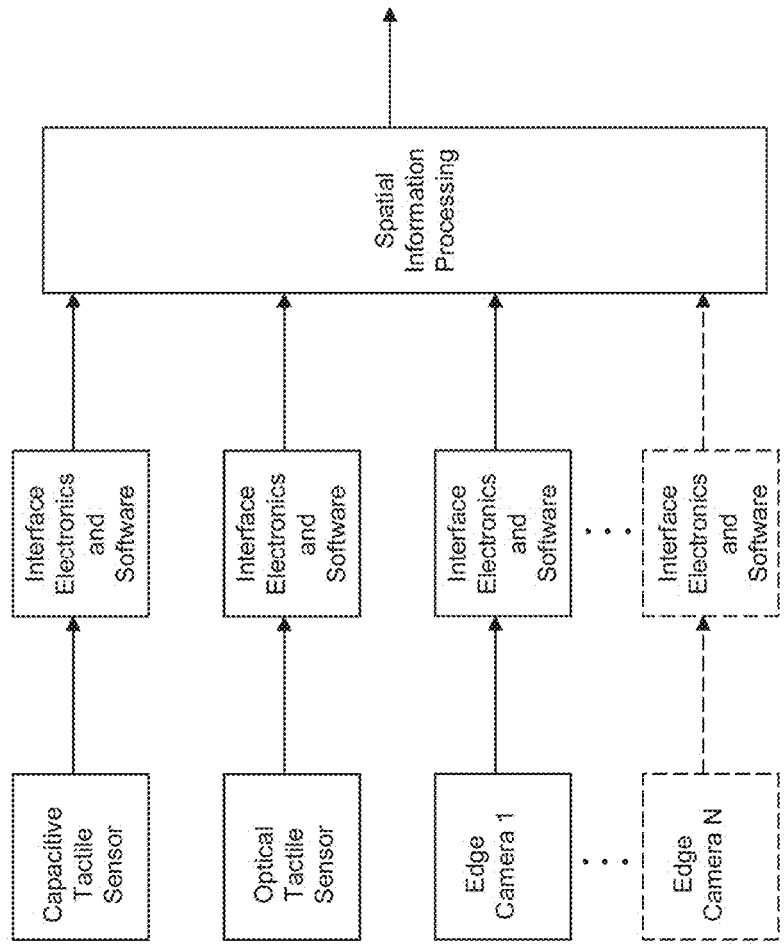
FIG. 36 illustrates an exemplary variation on the arrangement of FIG. 33 wherein each of the tactile sensors and edge cameras produce signals provided to interfacing and software operations, and each of these in turn subsequently directly provide information to a common spatial information processing stage which produces output signals responsive to the measured and observed contact.

FIG. 36 illustrates an example variation on the arrangement of FIG. 33 wherein each of the tactile sensors and edge cameras produce signals provided to interfacing and software operations, and each of these in turn subsequently directly provide information to a common spatial information processing stage which produces output signals responsive to the measured and observed contact. Such an interfacing and processing arrangement can be used, for example, with the configurations depicted in FIGS. 22C-22D, 23C-23D, 24C-24D, and 25C-25D. Note this interfacing and processing arrangement is naturally associated with the second structural approach.

Compensation for Non-Ideal Behavior of Tactile Sensor Arrays

Individual sensor elements in a tactile sensor array may produce measurements that vary sensor-by-sensor when presented with the same stimulus. Inherent statistical averaging of the algorithmic mathematics (included for instance in instructions 2130) can damp out much of this, but for small image sizes (for example, as rendered by a small finger or light contact), as well as in cases where there are extremely large variances in sensor element behavior from sensor to sensor, embodiments of the present invention provide for each sensor to be individually calibrated in implementations where that can be advantageous. Sensor-by-sensor measurement value scaling, offset, and nonlinear warpings can be invoked for all or selected sensor elements during data acquisition scans. Similarly, embodiments of the invention provide for individual noisy or defective sensors can be tagged for omission during data acquisition scans.

Example Handling and Processing for Multiple Sensor Configurations

The previous section provided a number of examples of interfacing and processing arrangements for multiple sensor configurations. This section provides examples of the handling and processing of the measured contact information produced by one or more tactile sensors and the observed contact information produced by one or more video cameras located on the edges of a touch sensing region.

In addition to the at least two general types of structural approaches described and cited repeatedly above, the handling and processing can additionally include aspects of at least four approaches to transforming sensor measurements video camera signals into user interface output signals:

functional partition wherein some user interface output signals are obtained from one or more of a first group of sensors and/or video cameras while other user interface output signals are obtained from one or more of a second group of sensors and/or video cameras;

internally-decision-based wherein some user interface output signals are selectively obtained from one or more of a groups of sensors and/or video cameras, the selections made responsive to measurements or observations of some sensors and/or video cameras within the one or more groups;

externally-decision-based wherein some user interface output signals are selectively obtained from one or more of a groups of sensors and/or video cameras, the selections made responsive to measurements or observations of some sensors and/or video cameras that are not members of the one or more groups;

sensor-fusing wherein user interface output signals are obtained from collective processing sensor measurements and/or video cameras signals An example of a functional partition approach would be to use a tactile sensor measurements for calculating left-right position ("x"), forward-back position ("y"), and yaw angle of at least one finger in contact with the tactile sensor and calculating pitch and roll angles of that finger from the signals provided by one or more video cameras observing that finger in contact with the tactile sensor.

An example of an internally-decision-based approach would be to use optical tactile sensor measurements for calculating the pitch angle of at least one finger in contact with a multiple-sensor tactile sensor surface within a first range of optical tactile sensor measurement values and use capacitive sensor measurements for calculating the pitch angle of at least one finger in contact with a multiple-sensor tactile sensor surface outside that first range of optical tactile sensor measurement values.

Implementation of internally-decision-based approaches can include threshold testing, conditional testing, vector quantization, algorithms employing parameterized calculations, algorithms employing compensation calculations and operations, artificial neural networks, etc. Other approaches can also be employed and are anticipated by the invention.

An example of an externally-decision-based approach would be to use optical tactile sensor measurements for calculating the pitch angle of at least one finger in contact with a multiple-sensor tactile sensor surface within a first range of observed video camera signals and use capacitive sensor measurements for calculating the pitch angle of at least one finger in contact with a multiple-sensor tactile sensor surface outside that first range of video camera signals.

Implementation of externally-decision-based approaches can include threshold testing, conditional testing, vector quantization, algorithms employing parameterized calculations, algorithms employing compensation calculations and operations, artificial neural networks, etc. Other approaches can also be employed and are anticipated by the invention.

An example of a sensor fusion approach would be to use observed video camera signals to invoke compensation or adjustments to calculations performed on tactile sensor measurement values, and use these compensation or adjustments to calculations performed on tactile sensor measurement values to create user interface output signals responsive to the location and orientation of the at least one finger as observed by the cameras.

Another example of a sensor fusion approach would be to use the observed video camera signals from at least two video cameras to create a 3-space representation of the location and orientation of at least one finger, and create user interface output signals responsive to the 3-space representation of the location and orientation of the at least one finger.

Implementation of sensor fusion approaches can include threshold testing, conditional testing, vector quantization, algorithms employing parameterized calculations, algorithms employing compensation calculations and operations, artificial neural networks, etc. Other approaches can also be employed and are anticipated by the invention.

While the invention has been described in detail with reference to disclosed embodiments, various modifications within the scope of the invention will be apparent to those of ordinary skill in this technological field. It is to be appreciated that features described with respect to one embodiment typically can be applied to other embodiments.

The invention can be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

Although exemplary embodiments have been provided in detail, various changes, substitutions and alternations could be made thereto without departing from spirit and scope of the disclosed subject matter as defined by the appended claims. Variations described for the embodiments may be realized in any combination desirable for each particular application. Thus particular limitations and embodiment enhancements described herein, which may have particular advantages to a particular application, need not be used for all applications. Also, not all limitations need be implemented in methods, systems, and apparatuses including one or more concepts described with relation to the provided embodiments. Therefore, the invention properly is to be construed with reference to the claims.

What is claimed is:

1. A system for implementing a user interface, the system comprising:
    a processor for executing instructions;
    a first tactile sensing arrangement for providing a plurality of tactile sensing measurements to the processor, wherein a first tactile sensing measurements is in response to receiving tactile input provided by an object; and
    a secondary information sensing arrangement for providing secondary information to the processor, wherein the secondary information is in response:
        a second tactile sensing arrangement providing another tactile sensing measurement, wherein the second tactile sensing arrangement is separate from the first tactile sensing arrangement;
    wherein the processor is configured to execute instructions to:
    in response to a combination of the first tactile sensing measurements when the object is in physical contact with the first tactile sensing arrangement and the secondary information from the second tactile sensing arrangement when the object is to be measured by the secondary information sensing arrangement, generate user interface output signals, wherein the user interface output signals are produced from spatial information processing acting on one or more values of the first tactile sensing measurements and the secondary information from the combination when the object is in physical contact with the first tactile sensing arrangement.

2. The system of claim 1, wherein the first tactile sensing arrangement is a capacitive tactile sensor and the secondary information sensing arrangement comprises second tactile input provided from an optical tactile sensor.

3. The system of claim 2 wherein the secondary information sensing arrangement further comprises at least one video camera.

4. The system of claim 1, wherein the first tactile sensing arrangement is an optical tactile sensor and the secondary information sensing arrangement comprises second tactile input provided from a capacitive tactile sensor.

5. The system of claim 4 wherein the secondary information sensing arrangement further comprises at least one video camera.

6. The system of claim 1, wherein the first tactile sensing arrangement is a proximity sensor and the secondary information sensing arrangement comprises second tactile input provided from a pressure sensor.

7. The system of claim 1, wherein the first tactile sensing arrangement is a pressure sensor the secondary information sensing arrangement comprises second tactile input provided from a proximity sensor.

8. The system of claim 1 wherein the secondary information sensing arrangement comprises at least one video camera.

9. The system of claim 1 wherein the secondary information sensing arrangement comprises at least two video cameras.

10. The system of claim 1 further comprising a functional partition to generate first user interface output signals based on a combination of tactile sensing measurements and secondary information from a first set of tactile sensing arrangements and secondary information sensing arrangements, and to generate second user interface output signals based on a combination of tactile sensing measurements and secondary information from a second set of tactile sensing arrangements and secondary information sensing arrangements.

11. The system of claim 10 further comprising an internal decision arrangement to select one set from the first and second sets of tactile sensing arrangements and secondary information sensing arrangements, the selection made responsive to corresponding measurements by at least a subset of the first and second sets of tactile sensing arrangements.

12. The system of claim 10 further comprising an external decision arrangement to select one set from the first and second sets of tactile sensing arrangements and secondary information sensing arrangements, the selection made responsive to measurements by a third set of tactile sensing arrangements and secondary information sensing arrangements.

13. The system of claim 1 wherein the instructions comprise sensor-fusing wherein the user interface output signals are obtained from threshold testing.

14. The system of claim 1 wherein the instructions comprise sensor-fusing wherein the user interface output signals are obtained from conditional testing.

15. The system of claim 1 wherein the instructions comprise sensor-fusing wherein the user interface output signals are obtained from vector quantization.

16. The system of claim 1 wherein the instructions comprise sensor-fusing wherein the user interface output signals are obtained from parameterized calculations.

17. The system of claim 1 wherein the instructions comprise sensor-fusing wherein the user interface output signals are obtained from compensation calculations and operations.

18. The system of claim 1 wherein the instructions comprise sensor-fusing wherein the user interface output signals are obtained from an artificial neural network.

* * * * *